US012717162B2

(12) United States Patent
Takahashi et al.

(10) Patent No.: US 12,717,162 B2
(45) Date of Patent: Aug. 25, 2026

(54) AIR FLOATING VIDEO DISPLAY APPARATUS

(71) Applicant: MAXELL, LTD., Kyoto (JP)

(72) Inventors: Hiroaki Takahashi, Kyoto (JP); Koji Hirata, Kyoto (JP); Koji Fujita, Kyoto (JP); Yasuyuki Ozawa, Aichi (JP); Takahito Kawasaki, Aichi (JP); Mutsuki Ukai, Aichi (JP)

(73) Assignee: MAXELL, LTD., Kyoto (JP)

( * ) Notice: Subject to any disclaimer, the term of this patent is extended or adjusted under 35 U.S.C. 154(b) by 295 days.

(21) Appl. No.: 18/572,576

(22) PCT Filed: Jun. 24, 2022

(86) PCT No.: PCT/JP2022/025404
§ 371 (c)(1),
(2) Date: Dec. 20, 2023

(87) PCT Pub. No.: WO2022/270636
PCT Pub. Date: Dec. 29, 2022

(65) Prior Publication Data

US 2024/0288709 A1 Aug. 29, 2024

(30) Foreign Application Priority Data

Jun. 25, 2021 (JP) ................................. 2021-105463

(51) Int. Cl.
*G02B 30/56* (2020.01)
*G02F 1/1335* (2006.01)
*H05K 5/02* (2006.01)

(52) U.S. Cl.
CPC ....... *G02B 30/56* (2020.01); *G02F 1/133512* (2013.01); *G02F 1/133528* (2013.01); *G02F 1/133553* (2013.01); *H05K 5/0217* (2013.01)

(58) Field of Classification Search
CPC ............... G02B 30/56; G02F 1/133512; G02F 1/133528; G02F 1/133553; H05K 5/0217;
(Continued)

(56) References Cited

U.S. PATENT DOCUMENTS

2004/0145457 A1* 7/2004 Schofield .............. B60S 1/0844 340/425.5
2006/0280555 A1* 12/2006 Forrer ..................... E01F 9/553 404/16

(Continued)

FOREIGN PATENT DOCUMENTS

JP 2006-113476 A 4/2006
JP 2015-040943 A 3/2015

(Continued)

OTHER PUBLICATIONS

International Search Report of PCT/JP2022/025404 dated Sep. 13, 2022.

*Primary Examiner* — Mariam Qureshi
(74) *Attorney, Agent, or Firm* — MATTINGLY & MALUR, PC

(57) ABSTRACT

An air floating video with high visibility suitable for use in a vehicle is provided that contributes to Sustainable Development Goals 3: "Ensure healthy lives and promote well-being for all at all ages," and 9: "Build resilient infrastructure, promote inclusive and sustainable industrialization and foster innovation." The air floating video display apparatus includes a housing which is attachable at a position near a ceiling or a rearview mirror in the vehicle and stores a video display apparatus. A retroreflector on which a λ/4 plate is provided and a polarization separation member arranged at a predetermined angle are provided outside the housing. A video light of a specific polarized wave from the video display apparatus is subjected to polarization conversion via the polarization separation member, the retroreflector, etc., (Continued)

and an air floating video is displayed at a predetermined position on the basis of the video light of the other polarized wave.

13 Claims, 22 Drawing Sheets

(58) Field of Classification Search
CPC ........ B60K 2360/691; B60K 2360/771; B60K 2360/797; B60K 35/211; G09F 19/18; G09F 21/04
See application file for complete search history.

(56) References Cited

U.S. PATENT DOCUMENTS

| | | | | |
|---|---|---|---|---|
| 2010/0014053 | A1 | 1/2010 | Brentnall, III et al. | |
| 2015/0248014 | A1* | 9/2015 | Powell | G02F 1/1334 359/479 |
| 2017/0227929 | A1 | 8/2017 | Suginohara | |
| 2018/0031878 | A1* | 2/2018 | Koito | G02B 5/124 |
| 2018/0284470 | A1 | 10/2018 | Yamamoto et al. | |
| 2019/0227489 | A1 | 7/2019 | Tokuchi | |
| 2020/0007857 | A1 | 1/2020 | Kasahara et al. | |

FOREIGN PATENT DOCUMENTS

| | | | |
|---|---|---|---|
| JP | 2017-107165 | A | 6/2017 |
| JP | 2017-142370 | A | 8/2017 |
| JP | 2019-128722 | A | 8/2019 |
| WO | 2018/168626 | A1 | 9/2018 |

* cited by examiner ( A )

FIRST EXAMPLE

FIFTH EXAMPLE

SEVENTH EXAMPLE

EIGHTH EXAMPLE 2101
3
106
2100
2102
107
2103
2106
2105

2101
106
3
2108
2107
107
2102
2100
2103

AIR FLOATING VIDEO DISPLAY APPARATUS

TECHNICAL FIELD

The present invention relates to a technique for an air floating video display apparatus.

BACKGROUND ART

As an example of the air floating video display apparatus, Patent Document 1 discloses the description of "a CPU of an information processing apparatus includes an approaching direction detector configured to detect an approaching direction of a user to an image formed in the air, an input coordinate detector configured to detect coordinates where an input is detected, an operation receiver configured to process a reception of operation, and an operation screen updater configured to update an operation screen according to a received operation. The CPU receives a motion of the user as an operation when the user approaches the image from a predetermined direction, and performs the processing according to the operation".

RELATED ART DOCUMENTS

Patent Documents

Patent Document 1: Japanese Unexamined Patent Application Publication No. 2019-128722

SUMMARY OF THE INVENTION

Problems to be Solved by the Invention

Although the air floating video display apparatus of Patent Document 1 can improve the operability of the air floating video, it does not take into consideration the improvement of the visual resolution and contrast of the air floating video, and further improvement in video quality has been demanded under current circumstances.

The air floating video display apparatuses have a wide range of applications, and can achieve the effect of attracting the attention of a lot of people from the rarity of "floating video is displayed in the air" that is not possible in the conventional flat display if used as signage (advertising billboards). In addition, as described in Patent Document 1, if an air floating video is used as a human interface for performing some kind of operation, it is possible to achieve the effect of preventing virus infection via contact parts such as push buttons owing to its non-contact feature.

On the other hand, if it is possible to readily install the air floating video display apparatus in vehicles such as automobiles, it is possible to give route guidance and point of interest (POI) information to a driver by, for example, video and voice of a human (concierge) displayed as an air floating video. Conversely, if the driver can instruct the concierge to set the temperature of the air conditioner, select music, and the like and the concierge can respond to the instructions by video and voice, it will be possible to provide safer, more comfortable, and visually stimulating driving assistance than that by the normal instruction using button operations. Voice utterance by the concierge or voice recognition and response to the driver's voice by the concierge can be realized using a known technique that has been already provided in a vehicle.

An object of the present invention is to provide an air floating video display apparatus particularly suitable for use in vehicles and capable of displaying an air floating video with high visibility.

Means for Solving the Problem

In order to solve the problem described above, for example, the configuration described in claims is adopted. Although this application includes a plurality of means for solving the problem, one example thereof can be presented as follows. That is, an air floating video display apparatus is an air floating video display apparatus configured to display an air floating video, and the air floating video display apparatus includes: a first housing configured to store a video controller; a second housing connected by wire or wirelessly to the first housing, attachable at a position near a ceiling or a rearview mirror in a vehicle, and configured to store a video display apparatus; a retroreflector arranged outside the second housing so as to face the video display apparatus and having a λ/4 plate provided on a retroreflection surface; and a polarization separation member arranged at a predetermined angle with respect to the video display apparatus and the retroreflector, in a space connecting the video display apparatus and the retroreflector outside the second housing, wherein the video display apparatus includes a light source apparatus and a liquid crystal display panel as a video source, and wherein a video light of a specific polarized wave emitted from the liquid crystal display panel passes through the polarization separation member, is reflected by the retroreflector, and passes through the λ/4 plate to be subjected to polarization conversion into a video light of the other polarized wave, the video light of the other polarized wave is reflected by the polarization separation member, and an air floating video that is a real image is displayed at a predetermined position on the basis of the reflected video light.

Effects of the Invention

According to a typical embodiment of the present invention, it is possible to provide an air floating video display apparatus particularly suitable for use in vehicles and capable of displaying an air floating video with high visibility. The problems, configurations, and effects other than those described above will be apparent from the following description of the embodiments.

BRIEF DESCRIPTION OF THE DRAWINGS

FIG. 2 is a diagram illustrating a V-shape configuration as an example of a main part configuration of the air floating video display apparatus according to the example of the present invention.

DETAILED DESCRIPTION OF PREFERRED EMBODIMENTS

Figure 1:
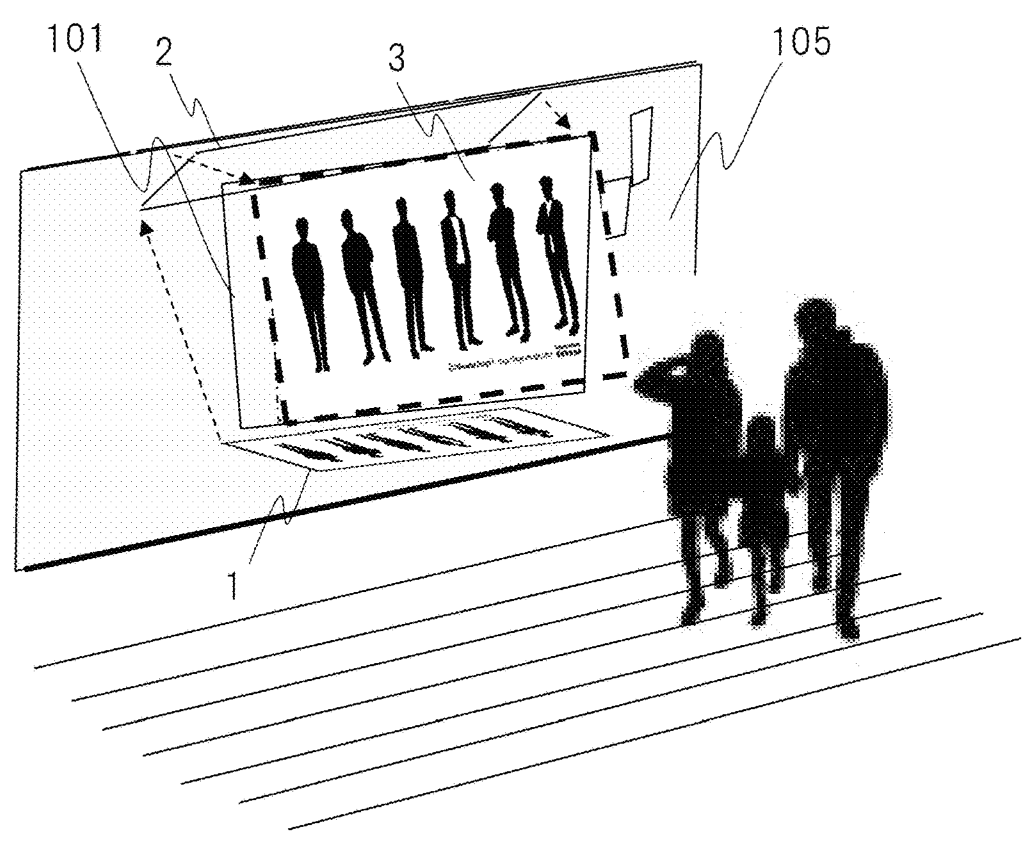
FIG. 1 is a diagram illustrating an example of a usage mode of an air floating video display apparatus according to an example of the present invention.
Figure 1:
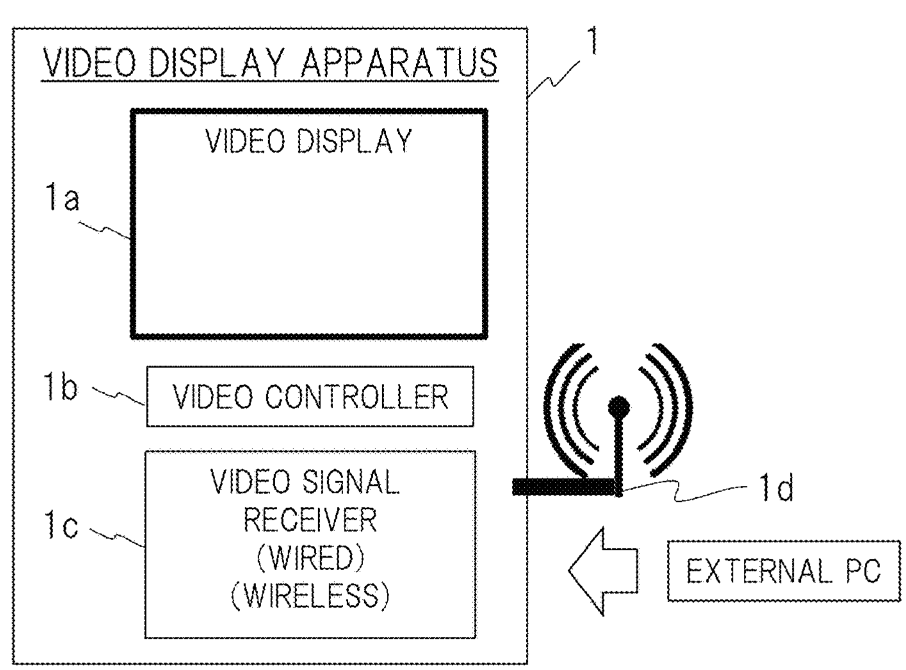

Hereinafter, an embodiment of the present invention will be described in detail with reference to the drawings. In the drawings, the same components are denoted by the same reference characters in principle, and repeated description thereof will be omitted. In the drawings, for easy understanding of the invention, each component does not represent an actual position, size, shape, range, and the like in some cases. In terms of description, in a case where processing by a program is described, the program, a function, a processor, and the like are mainly described in some cases, but the main body thereof as hardware is a processor or a controller, an apparatus, a computer, a system, or the like composed of the processor or the like. The computer executes processing in accordance with a program read on a memory by the processor, while appropriately using resources such as a memory or a communication interface. As a result, a predetermined function, a processing unit, and the like are implemented. The processor is composed of, for example, a semiconductor device such as a CPU or a GPU, or the like. The processor is composed of a device and a circuit that can perform predetermined calculation. The processing is not limited to software program processing and can be implemented by a dedicated circuit. As the dedicated circuit, an FPGA, an ASIC, a CPLD, or the like can be applied. The program may be installed in a target computer in advance as data or may be distributed and installed as data from a program source to the target computer. The program source may be a program distribution server on a communication network or may be a non-transitory computer-readable storage medium (memory card or the like) or the like. The program may be composed of a plurality of modules. A computer system may be composed of a plurality of apparatuses. The computer system may be composed of a client server system, a cloud computing system, or the like. Various types of data and information are composed of, for example, a structure of a table, a list, or the like, but are not limited thereto. Expressions such as identification information, an identifier, an ID, a name, and a number can be replaced with each other.

Embodiment

An air floating video display apparatus according to an embodiment includes a video display apparatus, a beam splitter that is a polarization separation member, and a retroreflector in which a λ/4 plate (retardation plate) is provided on a retroreflection surface. The video display apparatus includes a light source apparatus and a liquid crystal display panel configured to emit video light of a specific polarized wave (for example, P-polarized light) e (video display element). The light source apparatus generates and supplies light as backlight to the liquid crystal display panel. The polarization separation member is disposed in a space connecting the liquid crystal display panel of the video display apparatus and the retroreflector. The polarization separation member has a property of transmitting the video light of the specific polarized wave from the liquid crystal display panel toward the retroreflector and reflecting the video light of the other polarized wave (for example, S-polarized light) that has been subjected to polarization conversion by the retroreflector and the λ/4 plate. The video light of the other polarized wave after the reflection generates and displays an air floating video that is a real image at a predetermined position in a direction different from the video display apparatus.

In order to improve a contrast performance of the air floating video, the video display apparatus may be provided with a polarization converter configured to align light source light from the light source apparatus with polarized light in a specific direction. For example, the light source apparatus includes a point-like or planar light source, an optical element that reduces a divergence angle of light from the light source, the polarization converter that aligns the light from the light source with polarized light in a specific direction, and a light guide body having a reflection surface that propagates the light from the light source to the liquid crystal display panel, and the light source apparatus controls a video light flux of the video light from the liquid crystal display panel based on a shape and a surface roughness of the reflection surface.

Although not limited, in consideration of use in the vehicle in particular, the air floating video display apparatus according to the embodiment includes an air floating video display that can be installed near a ceiling or a rearview mirror in a vehicle and a video controller provided separately from the air floating video display. The video controller is mounted and stored in a first housing. The video display apparatus in the air floating video display is mounted and stored in a thin second housing, and the polarization separation member and the retroreflector are arranged outside the second housing. In the second housing, the video display apparatus configured to generate an air floating video with high visibility is incorporated.

The video controller in the first housing includes a video signal processing circuit configured to generate a video signal and a control signal to be supplied to the video display apparatus in the second housing, a memory configured to accumulate video materials, a power supply circuit configured to convert a voltage supplied from a battery of the vehicle into a predetermined voltage, and the like. The first housing and the second housing are connected by wire or wirelessly connected. The first housing may be installed on a dashboard of the vehicle or may be installed in a place invisible to a driver or a passenger (for example, in glove compartment).

An optical system including the polarization separation member, the retroreflector, and the like is arranged outside the second housing, in particular, on a lower side of the second housing. The optical system is not covered with a housing and is arranged so as to be suspended via a support column on the lower side of the second housing.

[Air Floating Video Display Apparatus]

The following example relates to, for example, an air floating video display apparatus capable of transmitting a video by video light from a large-area video light emitting source via a transparent member that partitions a space such as a glass of a show window and displaying the video as an air floating video inside or outside a space of a store. Furthermore, apart from the example above, the following other examples relate to an air floating video display apparatus capable of displaying a video by video light from a small-area (for example, about two to five inches) video light emitting source as an air floating video in a vehicle, by using an optical system composed of a beam splitter (in other words, polarization separation member), a retroreflection plate, and the like to be described later.

Note that, in the description of the examples below, a video floating in a space is expressed as a term "air floating video". Instead of this term, expressions such as an "aerial image", an "aerial floating video", an "air floating optical image of a display image", or an "aerial floating optical image of a display image" may be used. The term "air floating video" used in the description of the examples is used as a representative example of these terms.

According to the following examples, for example, high-resolution video information can be displayed on a glass surface of a show window or a light transmissive plate material in an air floating state. Furthermore, the air floating video display apparatus according to the examples can be installed even in a limited space such as the inside of the vehicle, and can present an air floating video to a person such as a driver without significantly reducing visibility due to external light reflection, unlike a conventional liquid crystal display panel or the like, even in a state in which strong light such as sunlight from the outside of the vehicle enters.

In the conventional air floating video display apparatus according to the related art, an organic EL panel or a liquid crystal display panel as a high-resolution color display video source is used in combination with a retroreflector. In the conventional air floating video display apparatus according to the related art, since video light is diffused at a wide angle, there have been following problems.

Figure 4:
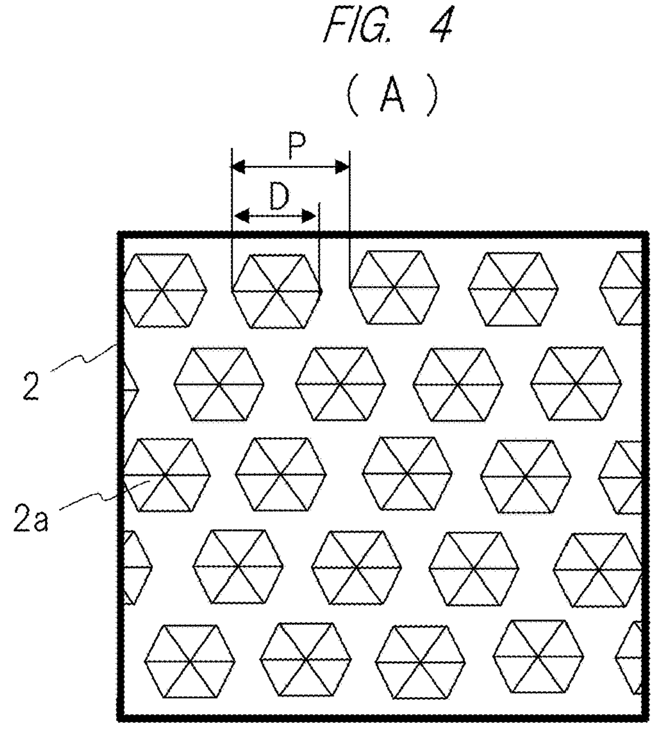
FIG. 4 is a diagram illustrating an example of a detailed structure of a retroreflector.
Figure 4:
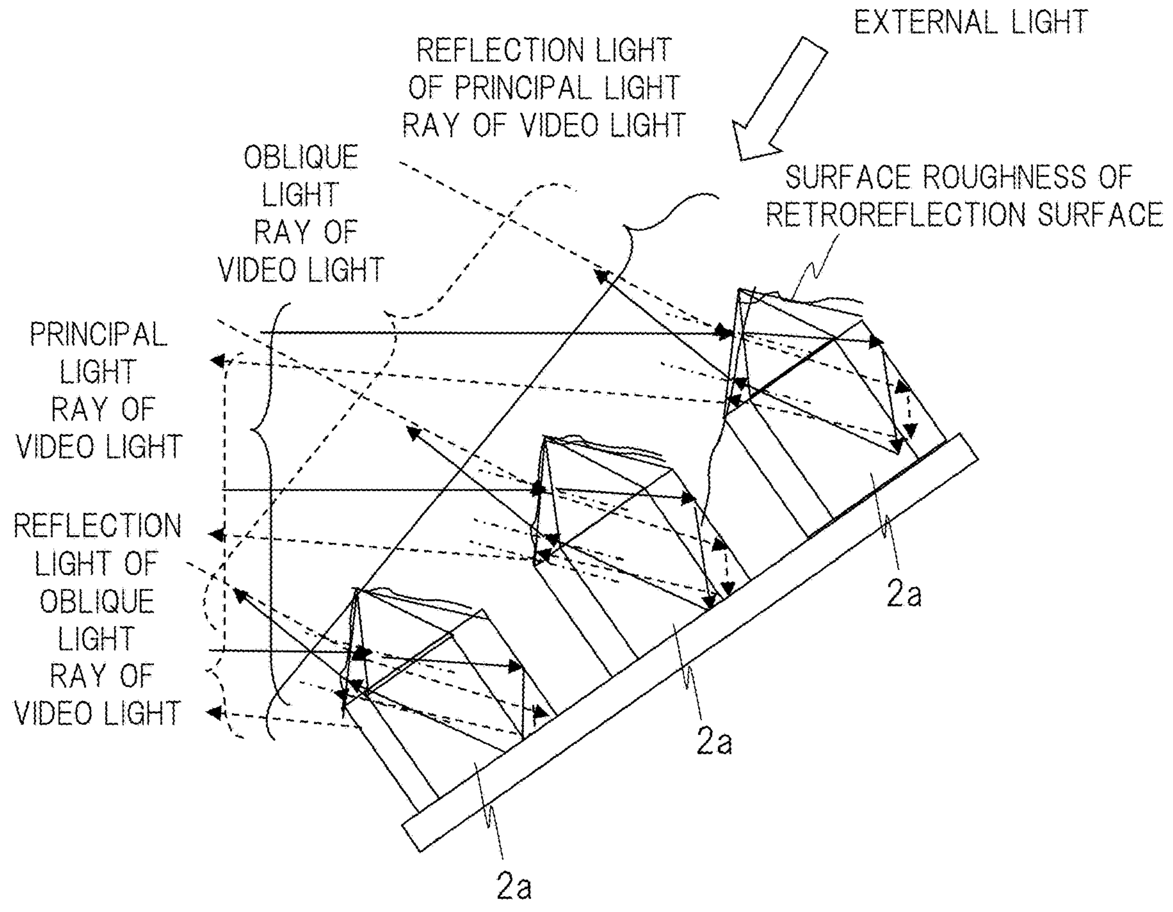

As illustrated in FIG. 4, since a retroreflection portion 2*a* is a hexahedron in a retroreflector 2 (retroreflection plate or retroreflection sheet), a ghost image is generated by the video light obliquely entering the retroreflector 2 in addition to the reflection light reflected normally, and this causes the problem of deteriorating the image quality of the air floating video.

Figure 5:
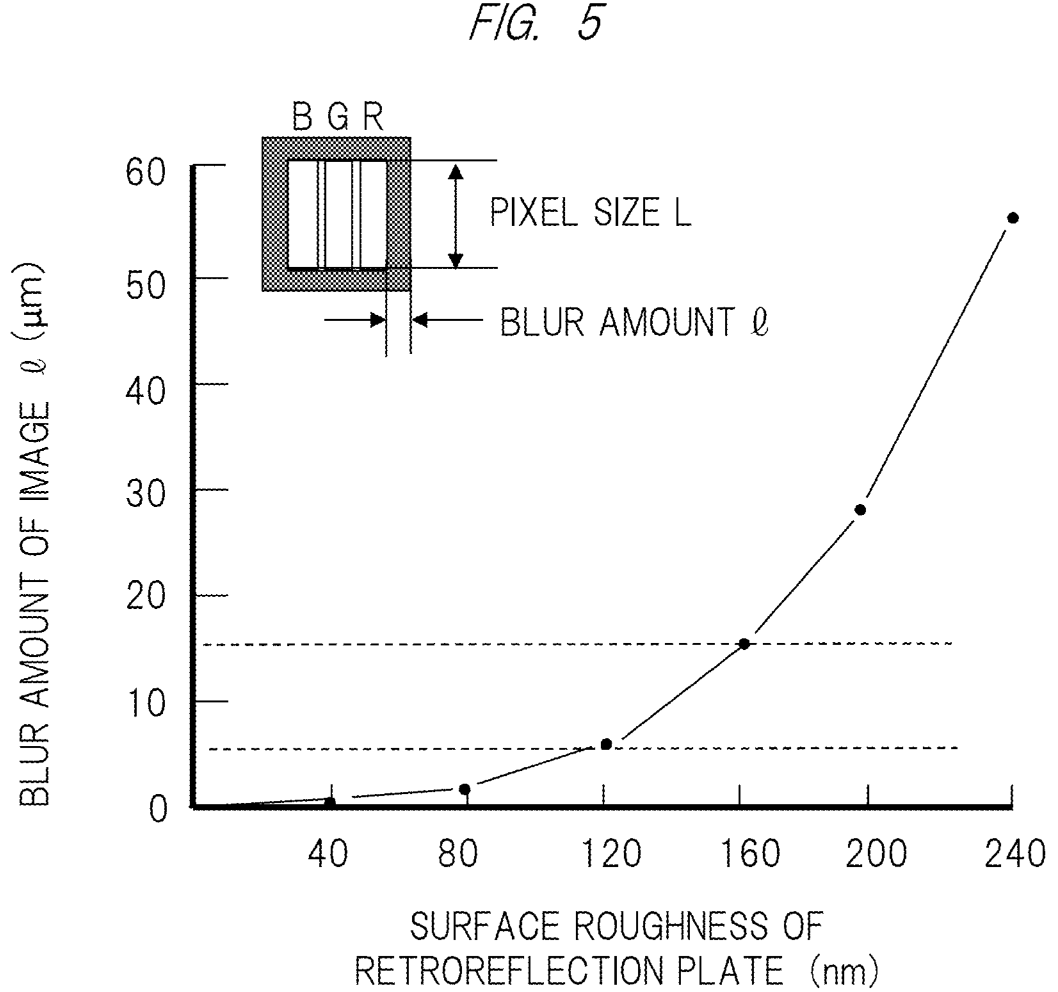
FIG. 5 is a characteristic diagram illustrating a relationship between a surface roughness of the retroreflector and a blur amount of a retroreflection image (air floating video).

Furthermore, as illustrated in FIG. 5, in an air floating video obtained by reflecting the video light from the video display apparatus as the video source by the retroreflector 2, there is also the problem of generating a blur for each pixel of the liquid crystal display panel in addition to the ghost image described above.

FIG. 1 illustrates an example of usage mode and a configuration example of an air floating video display apparatus according to one example of the present invention. FIG. 1(A) illustrates an overall configuration of the air floating video display apparatus according to the present example. For example, in a store or the like, a space is partitioned by a show window (window glass) 105 which is a light transmissive member such as a glass (described also as transparent member). The air floating video display apparatus according to the present example can display the air floating video to the outside of the space of the store in a single direction through such a transparent member. Specifically, light of a specific polarized wave with narrow-angle directional characteristics is emitted as a video light flux from a video display apparatus 1 in the air floating video display apparatus, once enters the retroreflector 2, is retroreflected and passes through the window glass 105, thereby forming an air floating video 3 that is a real image on the outside of the space of the store. FIG. 1(A) illustrates the case where the far side of the window glass 105 in the depth direction is the space inside the store and the near side in the depth direction is the space outside the store (for example, sidewalk). On the other hand, the air floating video 3 can be formed at a desired position in the store by providing a reflector configured to reflect a specific polarized wave on the window glass 105 and reflecting the video light flux.

FIG. 1(B) illustrates a block configuration of the video display apparatus 1 described above. The video display apparatus 1 includes a video display 1*a* configured to display an original image of the air floating video 3, a video controller 1*b* configured to convert an input video in accordance with the resolution of a panel of the video display 1*a*, a video signal receiver 1*c* configured to receive a video signal, and a receiving antenna 1*d*. The video signal receiver 1*c* is configured to handle signals input via a wired communication such as a universal serial bus (USB: registered trademark) input or a high-definition multimedia interface (HDMI: registered trademark) input and handle signals input via a wireless communication such as wireless fidelity (Wi-Fi: registered trademark). The video display apparatus 1 can function independently as a video receiver/display, and can also display video information from an external PC, a tablet, a smartphone, and the like. Further, if a stick PC or the like is connected, the video display apparatus 1 can have the capability of calculation processing, image analysis processing, and the like.

[Air Floating Video Display Apparatus (V Shape)]

Figure 2:
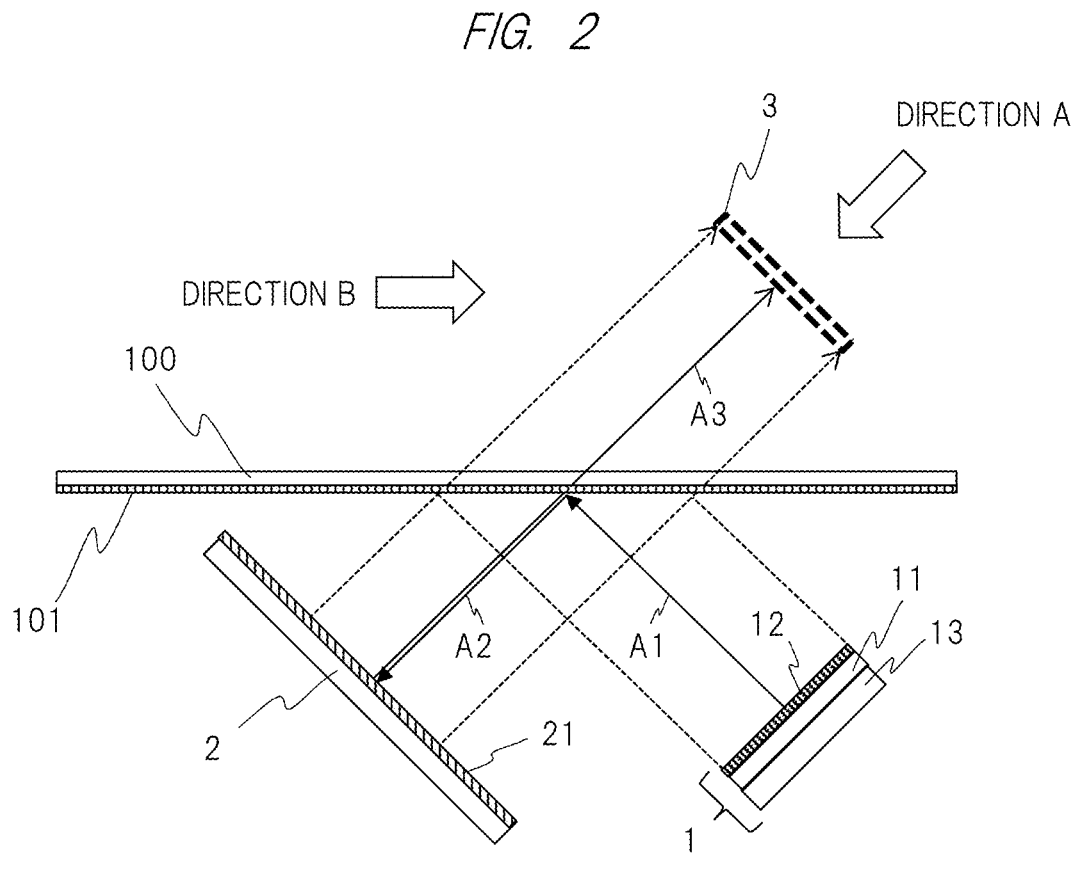

FIG. 2 illustrates a configuration example of a main part of the air floating video display apparatus according to the example. The example in FIG. 2 illustrates a configuration in which the video display apparatus 1 and the retroreflector (in other words, retroreflection plate) 2 are arranged in an approximately V shape or a V shape (hereinafter, referred to as V-shape configuration). As illustrated in FIG. 2, in the V-shape configuration, the video display apparatus 1 configured to generate the video light of the specific polarized wave is provided in an oblique direction (direction corresponding to optical axis A1) with respect to a transparent member 100 such as glass (arranged in horizontal direction in this example). Furthermore, the retroreflector 2 is provided in another oblique direction (direction corresponding to optical axis A2) with respect to the transparent member 100. The video display apparatus 1 includes a light source apparatus 13, a liquid crystal display panel 11 that is a liquid crystal display element, an absorption-type polarization plate 12, and the like.

In FIG. 2, the video light of the specific polarized wave emitted from the liquid crystal display panel 11 of the video display apparatus 1 is reflected by a beam splitter 101 (polarization separation member) that has a film for selectively reflecting the video light of the specific polarized wave and is provided on the transparent member 100, and the reflected light enters the retroreflector 2. In this example, the beam splitter 101 is formed in a sheet-like shape and is adhered to a lower surface of the transparent member 100.

A λ/4 plate 21 is provided on a video light incident surface (in other words, retroreflection surface) of the retroreflector 2. In other words, the λ/4 plate 21 is a polarization conversion element, a retardation plate, or a ¼ wave plate.

The video light on the optical axis A2 from the beam splitter 101 is subjected to polarization conversion from the specific polarized wave (one polarization) to the other polarized wave, by passing through the λ/4 plate 21 twice in total at the time of entering the retroreflector 2 and at the time of emission from the retroreflector 2. Here, the beam splitter 101 configured to selectively reflect the video light of the specific polarized wave has a property of transmitting the video light of the other polarized wave after the polarization conversion. Therefore, the video light of the other polarized wave after the polarization conversion passes through the beam splitter 101. The video light that has passed through the beam splitter 101 forms and displays the air floating video 3 that is a real image, at a predetermined position outside the transparent member 100 in a direction of an optical axis A3 corresponding to the optical axis A2.

Note that the light that forms the air floating video 3 is a set of light rays converging from the retroreflector 2 to the optical image of the air floating video 3, and these light rays go straight even after passing through the optical image of the air floating video 3. Therefore, in the configuration of FIG. 2, when the user visually recognizes the air floating video 3 from the direction A indicated by an arrow corresponding to the optical axis A3, the air floating video 3 is visually recognized as a bright video. However, when another person visually recognizes the video from, for example, the direction B indicated by an arrow, the air floating video 3 cannot be visually recognized as a video at all. Such characteristics are very suitable in a case of being adopted in a system that displays a video requiring high security or a highly confidential video that is desired to be kept secret from a person facing the user.

Note that, depending on the performance of the retroreflector 2, the polarization axes of the video light after reflection become uneven in some cases. In this case, a part of the video light whose polarization axes become uneven is reflected by the beam splitter 101 described above and returns to the video display apparatus 1. This returned light is reflected again on the video display surface of the liquid crystal display panel 11 constituting the video display apparatus 1, so that the ghost image is generated and the image quality of the air floating video 3 is deteriorated in some cases. Therefore, in the present example, an absorption-type polarization plate 12 is provided on the video display surface of the video display apparatus 1. The video light emitted from the video display apparatus 1 is transmitted through the absorption-type polarization plate 12, and the reflected light returning from the beam splitter 101 is absorbed by the absorption-type polarization plate 12. In this way, the re-reflection described above can be suppressed, and it is possible to prevent deterioration in image quality due to the ghost image of the air floating video 3.

The beam splitter (polarization separation member) 101 described above may be formed of, for example, a reflection-type polarization plate or a metal multilayer film that reflects a specific polarized wave.

[Air Floating Video Display Apparatus (Z Shape)]

Figure 3:
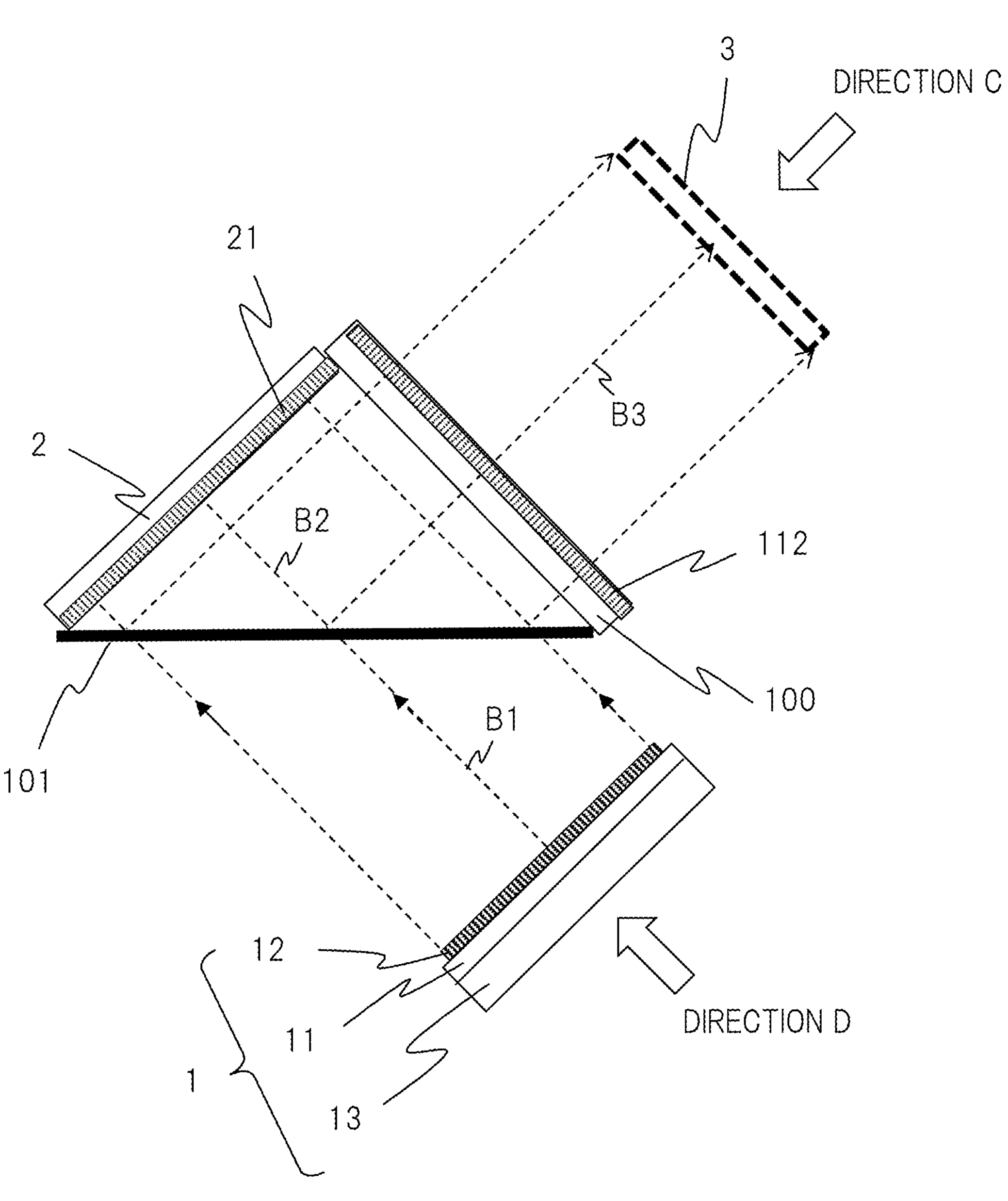
FIG. 3 is a diagram illustrating a Z-shape configuration as an example of the main part configuration of the air floating video display apparatus according to the example of the present invention.

FIG. 3 illustrates a configuration example of the main part of the air floating video display apparatus according to the example, different from the example in FIG. 2. The example in FIG. 3 illustrates a configuration in which the video display apparatus 1 and the retroreflector 2 (retroreflection plate) are arranged to face each other, and the beam splitter 101 is arranged in the space therebetween at an angle of about 45 degrees with respect to each of the video display apparatus 1 and the retroreflector 2 so as to form a schematically Z shape (or reverse Z shape) (hereinafter, referred to as Z-shape configuration). In this Z-shape configuration, with respect to the transparent member 100 such as a glass plate and an absorption-type polarization plate 112, the video display apparatus 1 and the retroreflector 2 are arranged at an angle of about 90 degrees, and the beam splitter 101 is arranged at an angle of about 45 degrees. In this example, the beam splitter 101 is arranged in the horizontal direction.

[Retroreflector]

FIG. 4(A) illustrates a surface shape of the retroreflector 2 (retroreflection plate) manufactured by Nippon Carbide Industries Co., Inc. used in this study as the typical retroreflector 2. FIG. 4(A) is a top view and FIG. 4(B) is a side view. On the surface of the retroreflector 2, the retroreflection portions 2*a* composed of regularly arranged hexagonal columns are provided. The light ray that has entered the retroreflection portion 2*a* is reflected by the wall surfaces and bottom surface of the hexagonal column and emitted as retroreflected light in a direction corresponding to the incident light. This emitted light forms the air floating video 3 as a normally reflected image (normal image) in the configurations illustrated in FIG. 2 and FIG. 3. On the other hand, as illustrated in FIG. 4(B), the ghost image (not illustrated) is formed at the position different from the normal image by the video light, which has obliquely entered the retroreflector 2, of the video light from the video display apparatus 1. This ghost image lowers the visibility of the air floating video 3.

Thus, in the present example (FIG. 3), the air floating video 3 that is a real image is displayed based on the video displayed on the video display apparatus 1 without forming the ghost image. The resolution of the air floating video 3 largely depends on the outer diameter D and pitch P of the retroreflection portions 2*a* of the retroreflector 2 illustrated in FIG. 4(A), in addition to the resolution of the liquid crystal display panel 11. For example, when the liquid crystal display panel 11 of a 7-inch WUXGA (1920×1200 pixels) is used, even if one pixel (one triplet) is about 80 μm, one pixel of the air floating video 3 is about 300 μm if the diameter D of the retroreflection portion 2*a* is 240 μm and the pitch P is 300 μm, for example. Therefore, the effective resolution of the air floating video 3 is reduced to about ⅓. Therefore, in order to make the resolution of the air floating video 3 equal to the resolution of the video display apparatus 1, it is desired that the diameter D and the pitch P of the retroreflection portions 2*a* are close to one pixel of the liquid crystal display panel. On the other hand, in order to suppress the occurrence of moire caused by the retroreflector 2 and the pixels of the liquid crystal display panel 11, it is preferable to design each pitch ratio so as not to be an integral multiple of one pixel. Further, the shape is preferably arranged such that any one side of the retroreflection portion 2*a* does not overlap with any one side of one pixel of the liquid crystal display panel 11.

The inventors of this application fabricated the video display apparatus 1 by combining the liquid crystal display panel 11 with a pixel pitch of 40 μm and the light source apparatus 13 with a narrow divergence angle (divergence angle of 15°) of the present example, and obtained the relationship between the acceptable blur amount l (small L) of the image of the air floating video 3 and the pixel size L (large L) by experiment in order to improve the visibility. FIG. 5 illustrates the experimental results. It has been found that the blur amount l that deteriorates the visibility is preferably 40% or less of the pixel size, and the blur is almost unnoticeable if it is 15% or less. Also, it has been found that the surface roughness of the reflection surface by which the blur amount l is an acceptable amount in this case has an average roughness of 160 nm or less in the range of the measurement distance of 40 μm, and the surface roughness of the reflection surface is desirably 120 nm or less for achieving the more unnoticeable blur amount l. Therefore, it is desirable to reduce the surface roughness of the retroreflector 2 described above and reduce the surface roughness including the reflection film forming the reflection surface and its protection film to the above-described value or less.

On the other hand, in order to manufacture the retroreflector 2 at a low cost, the retroreflector may be molded by using the roll press method. Specifically, this is a method of aligning retroreflection portions 2*a* and forming the retroreflection portions 2*a* on a film. In this method, the retroreflector 2 having a desired shape is obtained by forming a reverse shape of the shape to be formed on a roll surface, applying an ultraviolet curable resin on a fixing base material, forming a necessary shape by passing the resin between rolls, and curing the resin by irradiation with ultraviolet rays.

The video display apparatus 1 of the present example includes the liquid crystal panel 11 and the light source apparatus 13 (details in FIG. 6) configured as a light source to generate a light of a specific polarized wave, and thus there is low probability that the video light enters obliquely with respect to the retroreflector 2 described above. As a result, it is possible to provide the structurally superior system in which the generation of the ghost image can be suppressed and the brightness of the ghost image is low even if the ghost image is generated.

On the other hand, in the configuration of the Z-shape air floating video display apparatus illustrated in FIG. 3, the video display apparatus 1 including the liquid crystal display panel 11, the absorption-type polarization plate 12, and the light source apparatus 13 is arranged at a predetermined angle (for example, at an angle of about 45 degrees with respect to the beam splitter 101 on horizontal plane). The video light from the video display apparatus 1 passes through the beam splitter 101 in a direction of an optical axis B1 (oblique direction with respect to the beam splitter 101) and travels toward the retroreflector 2 in a direction of an optical axis B2 corresponding to the optical axis B1.

Here, the video light from the video display apparatus 1 is, for example, a video light having characteristics of P polarization (parallel polarization) as the light of the specific polarized wave. Furthermore, the beam splitter 101 is a polarization separation member such as a reflection-type polarization plate and has a property of transmitting the video light of P polarization from the video display apparatus 1 and reflecting the video light of 9 polarization (vertical polarization) conversely. This beam splitter 101 is formed of a reflection-type polarization plate or a metal multilayer film that reflects the specific polarized wave.

On the other hand, the λ/4 plate 21 is provided on the light incident surface (retroreflection surface) of the retroreflector 2. The video light of P polarization that has passed through the beam splitter 101 from the video display apparatus 1 is subjected to polarization conversion from the P polarization to the S polarization, by passing through the λ/4 plate 21 twice in total at the time of entering the retroreflector 2 and at the time of emission from the retroreflector 2. As a result, the video light of S polarization from the retroreflector 2 after the polarization conversion is reflected by the beam splitter 101 and travels toward the transparent member 100 or the like. The reflected video light of S polarization that has traveled in a direction corresponding to an optical axis B3 (oblique direction with respect to the beam splitter 101) passes through the transparent member 100 such as a glass plate and the absorption-type polarization plate 112, and generates and displays the air floating video 3 that is a real image at a predetermined position outside the transparent member 100 or the like.

Here, in order to suppress the deterioration in the image quality due to sunlight and illumination light entering the optical system composed of optical components such as the video display apparatus 1, the retroreflector 2, and the beam splitter 101, it is effective to provide the absorption-type polarization plate 112 on an outer surface of the transparent member 100. Since the polarization axes become uneven in some cases when the light is retroreflected by the retroreflector 2, a part of the video light is reflected by the beam splitter 101 and is returned toward the video display apparatus 1 in some cases. This returned light is reflected again by the video display surface of the liquid crystal display panel 11 constituting the video display apparatus 1, so that the ghost image is generated and the image quality of the air floating video 3 is significantly deteriorated.

Therefore, in both of the examples illustrated in FIG. 2 and FIG. 3, the absorption-type polarization plate 12 is provided on the video display surface of the video display apparatus 1. Alternatively, an antireflection film (not illustrated) may be provided on a video emission side surface of the absorption-type polarization plate 12 provided on the surface of the video display apparatus 1. In this way, the light to be the cause of generating the ghost image is absorbed by the absorption-type polarization plate 12, whereby the deterioration in the image quality due to the ghost image of the air floating video 3 is prevented.

Moreover, in the Z-shape configuration in FIG. 3, a strong ghost image is generated when external light directly enters the retroreflector 2. Therefore, in order to suppress and prevent the generation of the ghost image, this example has the configuration in which the retroreflector 2 is inclined downward with respect to an incident direction of the external light for preventing the entry of the external light. Specifically, a main incident direction of the external light is set to a direction (oblique direction like the optical axis B3) corresponding to a direction C indicated by an arrow (direction in which user visually recognizes the air floating video 3 from front side). In that case, the retroreflector 2 is arranged such that the optical axis B2 has a relationship of, for example, about 90 degrees with respect to the direction C (optical axis B3). In other words, a main surface of the retroreflector 2 is arranged so as to have a relationship of, for example, about 90 degrees with respect to a main surface of the transparent member 100 or the like. In this way, since the external light entering in the direction C does not directly enter the main surface (retroreflection surface) of the retroreflector 2, the generation of the ghost image is prevented.

Furthermore, the video display apparatus 1 is arranged in a direction different from the incident direction (direction C) of the external light. Specifically, the main surface (video light emission surface) of the video display apparatus 1 is arranged in the same direction as (in other words, in parallel to) the main surface of the retroreflector 2, and the optical axis B1 of the video display apparatus 1 is arranged to have a relationship of about 90 degrees with respect to the optical axis B3 corresponding to the incident direction (direction C) of the external light. Furthermore, when a range of a light flux in a case where the external light enters the main surface of the transparent member 100, which functions as an opening, in the direction C is considered, the video display apparatus 1 is arranged at a position slightly separated outside from the range. As a result, the generation of the ghost image due to the re-reflection in the video display apparatus 1 is reduced.

[Video Display Apparatus]

Figure 6:
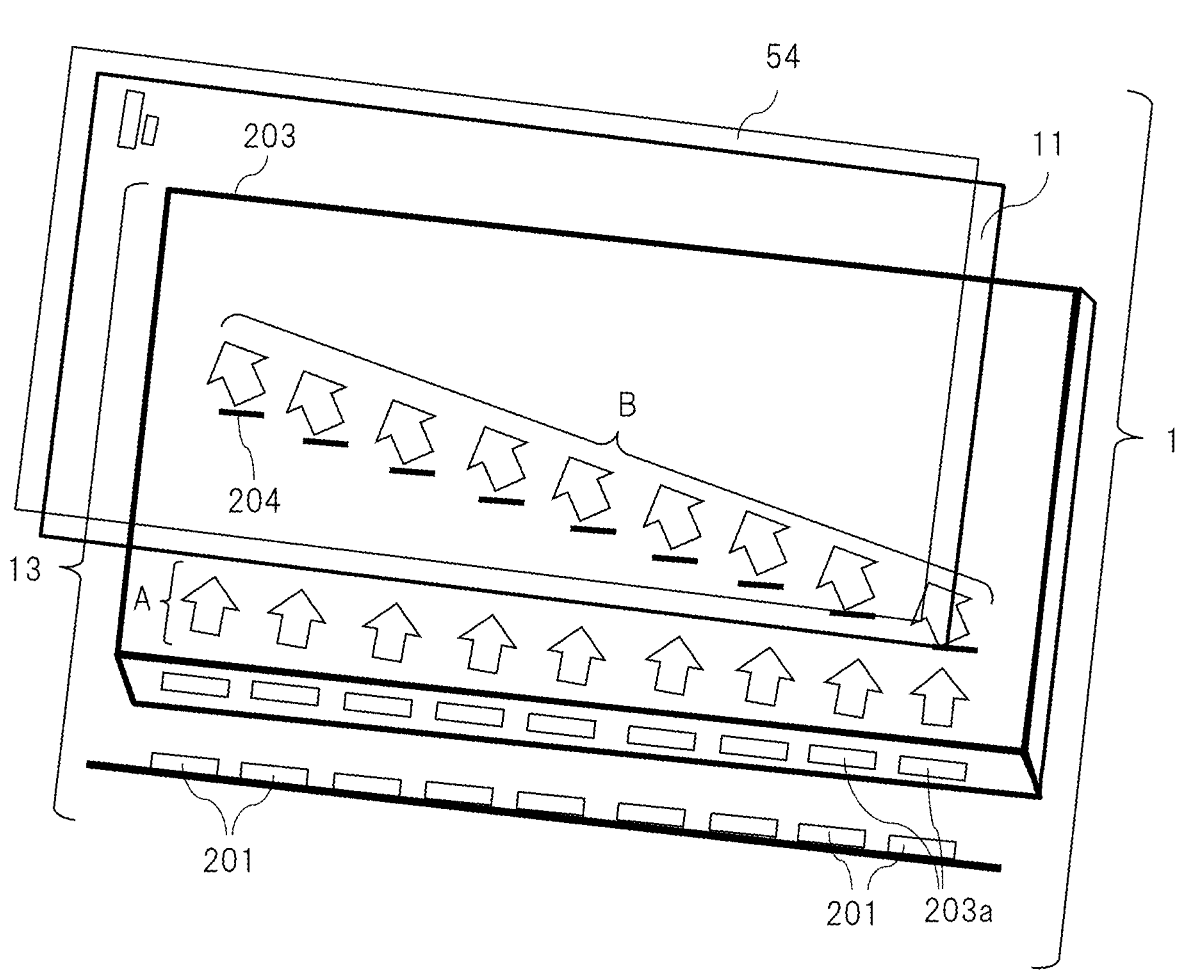
FIG. 6 is a diagram illustrating a configuration example of a video display apparatus.

FIG. 6 illustrates a configuration example of the video display apparatus 1 that is applicable to the examples in FIG. 2 and FIG. 3. The video display apparatus 1 includes the light source apparatus 13, the liquid crystal display panel 11, a light direction conversion panel 54, and the like. On a video emission surface side of the liquid crystal display panel 11, the absorption-type polarization plate 12 described above may be provided. The light source apparatus 13 is composed of a plurality of light emitting diode (LED) elements 201 that is a semiconductor light source (solid light source) constituting a light source, a light guide body 203, and the like. In FIG. 6, a state where the liquid crystal display panel 11 and the light direction conversion panel 54 are arranged on the light source apparatus 13 is illustrated as an exploded perspective view.

The light source apparatus 13 is formed of, for example, a case (not illustrated) made of plastic or the like and is configured to store the LED elements 201 and the light guide body 203 therein. A light receiving end surface 203*a* is provided on an end surface of the light guide body 203 in order to convert divergent light from each LED element 201 into a substantially parallel light flux. The light receiving end surface 203*a* has a shape whose cross sectional area gradually increases toward a facing surface with respect to the light receiving portion, and is provided with a lens shape having a function of gradually decreasing a divergence angle by making total reflection plural times during propagation therein.

Moreover, on an upper surface of the light guide body 203, the liquid crystal display panel 11 that is arranged substantially parallel to the light guide body 203 is attached. Furthermore, on one side surface (side surface on the lower side in FIG. 6) of the case of the light source apparatus 13, the plurality of LED elements 201 is attached. The light from the plurality of LED elements 201 is converted into substantially collimated light (substantially parallel light) by the shape of the light receiving end surface 203*a* of the light guide body 203. Therefore, the light receiving portion of the light receiving end surface 203*a* and the LED element 201 are attached so as to maintain a predetermined positional relationship.

The light source apparatus 13 is configured by attaching a light source unit, in which the plurality of LED elements 201 serving as a light source is arranged, to the light receiving end surface 203*a* serving as the light receiving portion provided on the end surface of the light guide body 203. A divergent light flux from the LED element 201 is converted into the substantially collimated light by a lens shape of the light receiving end surface 203*a* of the light guide body 203. The substantially collimated light is guided in the direction A indicated by the arrow inside the light guide body 203. The direction A is a direction substantially parallel to the liquid crystal display panel 11 (direction from bottom to top in drawing). A light flux direction of the light guided in the direction A is converted by a light flux direction converter 204 provided in the light guide body 203, and the light is emitted in a direction B indicated by an arrow toward the liquid crystal display panel 11 substantially parallel to the light guide body 203. The direction B is a direction substantially perpendicular to a display surface of the liquid crystal display panel 11.

The light guide body 203 has a configuration in which a distribution (in other words, density) of the light flux direction converter 204 is optimized by the shape of the inside or the surface of the light guide body 203. Accordingly, it is possible to control uniformity of light that is an emission light flux from the light source apparatus 13 indicated by the direction B and is an incident light flux to the liquid crystal display panel 11.

Moreover, in the video display apparatus 1 configured to include the light source apparatus 13 and the liquid crystal display panel 11, it is also possible to control directivity of the light from the light source apparatus 13 in the direction B in order to improve utilization efficiency of the emission light flux from the light source apparatus 13 indicated by the direction B and largely reduce power consumption. More specifically, a light source that has a narrow divergence angle can be configured as the light source apparatus 13. As a result, the video light from the video display apparatus 1 efficiently reaches an observer with high directivity (in other words, straightness) like laser light, and it is possible to display a high-quality air floating video with high resolution. At the same time, power consumption by the video display apparatus 1 including the LED elements 201 of the light source apparatus 13 can be significantly reduced.

Also, to a frame (not illustrated) of the liquid crystal display panel 11 attached to the upper surface of the case (not illustrated) of the light source apparatus 13, the liquid crystal display panel 11 attached to the frame, a flexible printed circuits (FPC) board (not illustrated) electrically connected to the liquid crystal display panel 11, and the like are attached. The liquid crystal display panel 11 which is a liquid crystal display element generates a display video together with the LED element 201 by modulating the intensity of transmitted light based on a control signal from a control circuit (not illustrated) constituting an electronic device.

<In-Vehicle Air Floating Video Display Apparatus (Z Shape)>

Next, an in-vehicle air floating video display apparatus according to each example will be described with reference to FIG. 7 and subsequent drawings. The air floating video display apparatus according to each example below corresponds to the Z-shape configuration in FIG. 3 described above as a basic configuration. For the function to form the air floating video 3, the components (video display apparatus 1, beam splitter 101, retroreflector 2, and the like) of the air floating video display apparatus are fixed to each other so as to have a predetermined positional relationship.

First Example (1)

Figure 7:
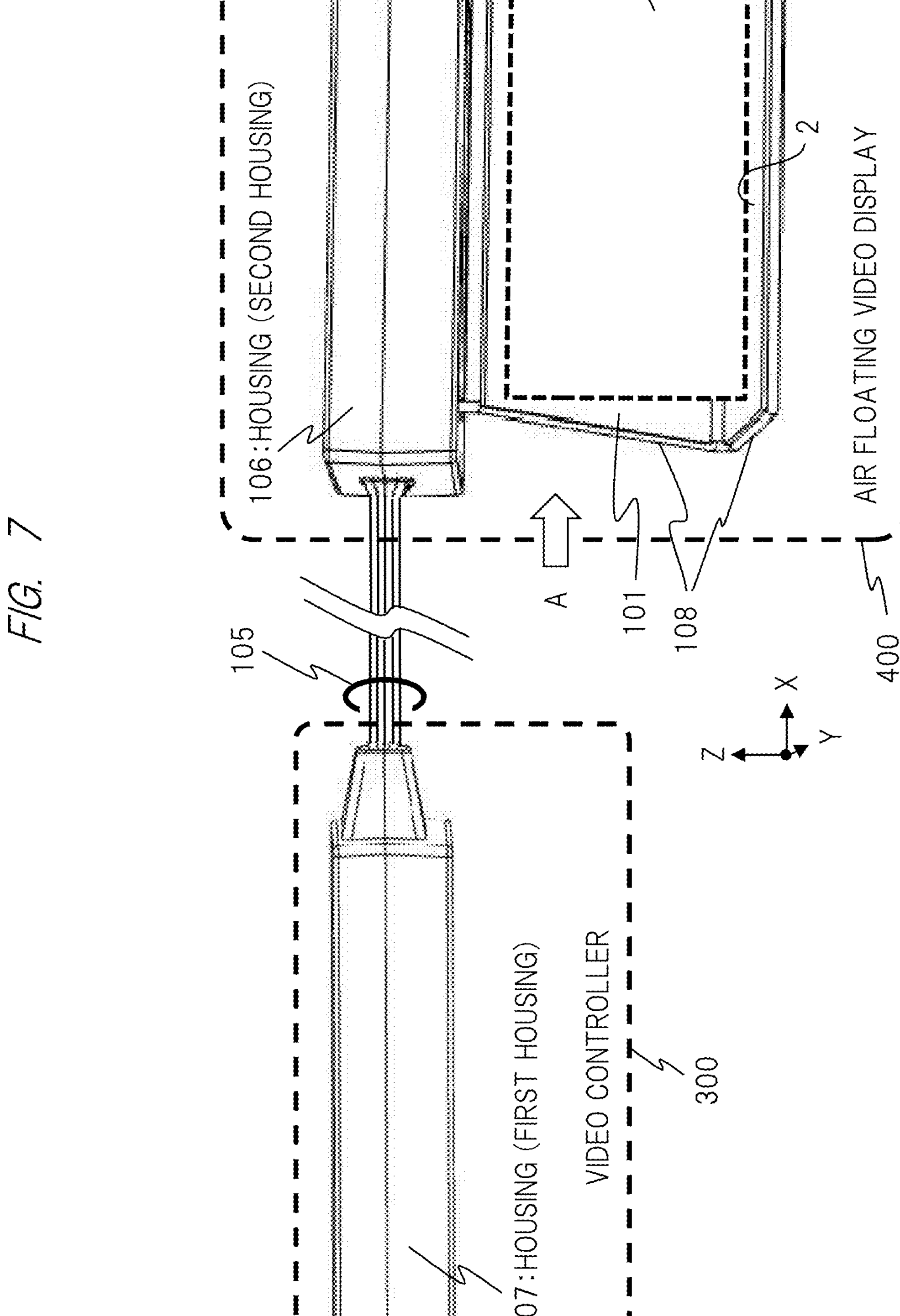
FIG. 7 is a diagram illustrating an external configuration example of an in-vehicle air floating video display apparatus according to the example.

FIG. 7 illustrates an external configuration example of the air floating video display apparatus suitable for in-vehicle use according to an example (referred to as first example). The air floating video display apparatus according to the first example illustrated in FIG. 7 roughly includes a video controller 300 (corresponding housing 107) and an air floating video display 400 (corresponding housing 106). The video controller 300 is mounted and stored in the housing 107 (in other words, video controller container) that is the first housing. The video display apparatus 1 in the air floating video display 400 is mounted and stored in the housing 106 (in other words, thin housing, video display apparatus container) that is the second housing. The housings 107 and 106 are connected by a wired cable 105. The cable 105 includes a control signal line, a power supply line, and the like. Note that, in a modification, the housings 107 and 106 may be connected wirelessly (for example, near field communication interface such as Wi-Fi).

Figure 10:
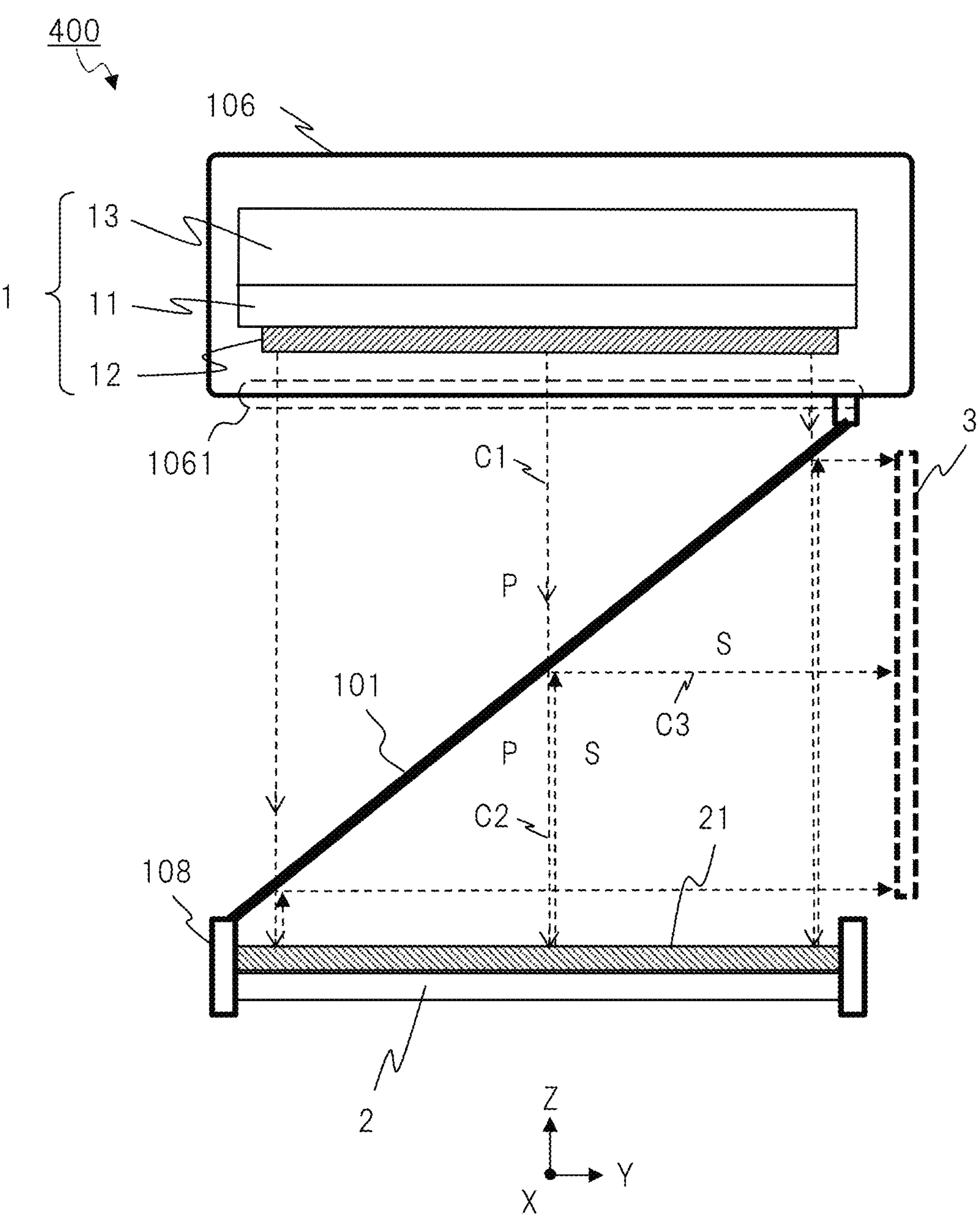
FIG. 10 is a diagram illustrating a configuration example of the air floating video display in a cross section seen from a side in the in-vehicle air floating video display apparatus according to the example.

In the present example, the components of the video display apparatus 1 like those in FIG. 6 are stored and fixed in the housing 106 (FIG. 10 to be described later). Then, the optical system composed of the beam splitter 101, the retroreflector 2, the λ/4 plate 21, and the like is arranged and fixed outside the housing 106, in particular, on a lower side of the housing 106 so as to be suspended by a support column 108.

FIG. 7 illustrates an appearance in a case where the air floating video display apparatus is viewed from a front side. Here, the front side of the apparatus is defined as a surface corresponding to a direction in which the user (in particular, driver) can visually recognize the air floating video 3 (indicated by broken line frame) formed by the air floating video display 400 from the front side. For description, a coordinate system and a direction such as (X, Y, Z) illustrated in the drawings are used in some cases. The Z direction is a vertical direction, that is, an up-down direction (vertical direction in the screen of the air floating video 3), and the X direction and the Y direction are two horizontal directions. Specifically, the X direction is a right-left direction (horizontal direction in the screen of the air floating video 3), and the Y direction is a depth direction, that is, a front-back direction (direction in which the user views the air floating video 3).

The video controller 300 is a portion in which the video controller 1*b*, the video signal receiver 1*c*, and the like in FIG. 1(B) are mounted. In the housing 107, a circuit board or the like that is a mounted object of the video controller 1*b*, the video signal receiver 1*c*, and the like is stored. The video controller 300 includes the video signal processing circuit configured to generate and supply a video signal and a control signal to the video display apparatus 1, the memory configured to accumulate data and information such as the video materials, the power supply circuit configured to convert a voltage supplied from a battery of the vehicle into a predetermined voltage, and the like as described above.

The air floating video display 400 is a portion in which the video display 1*a* in FIG. 1(B) is mounted, and is configured to include the housing 106 in which the video display apparatus 1 is stored, the beam splitter 101, the retroreflector (retroreflection plate) 2, the λ/4 plate 21, the support column 108, and the like. In the housing 106, the light source apparatus 13, the liquid crystal display panel 11, the absorption-type polarization plate 12, and the like constituting the video display apparatus 1 are stored and fixed (FIG. 10). The λ/4 plate 21 is provided on the retroreflection surface (upper surface in FIG. 7) of the retroreflector 2.

The thin housing regarding the housing 106 indicates that a thickness in the Z direction in the drawing is suppressed to be relatively small. In the present example, as illustrated in the drawing, the air floating video display 400 is separated from the housing 107 of the video controller 300, and has the configuration in which the beam splitter 101, the retroreflector 2, and the like are arranged outside the housing 106, in particular, on the lower side of the housing 106 so as to be exposed without being covered with the housing. Therefore, the housing 106 is relatively small (compact) and has a thin shape with a small thickness in the Z direction. In the present example, the air floating video display 400 is arranged and fixed so as to suspend the beam splitter 101, the retroreflector 2, and the like on the lower side of the housing 106 via the support column 108. Accordingly, in the case where the air floating video display 400 (in particular, air floating video 3) is viewed from a viewpoint of the user in the Y direction, that is, from the front side, the housing in the field of view of the user is only the thin housing 106. Therefore, the present example is suitably used because there are few objects that obstruct the field of view of the user and it is possible to enhance the sense of floating in the air of the air floating video 3.

The thicknesses of the beam splitter 101 and the retroreflector 2 are sufficiently thin. The main surface of the retroreflector 2 made of metal is arranged along the Y direction (for example, horizontal direction). Therefore, when the air floating video 3 is visually recognized from a viewpoint of the user in the Y direction, that is, from the front side, the retroreflector 2 is not so noticeable. Furthermore, in a case where the air floating video 3 is not displayed and the air floating video display apparatus is not used, the beam splitter 101 looks semitransparent and a landscape or the like behind (on the far side of) the beam splitter 101 can be visually recognized to some extent when the air floating video display 400 is viewed from the viewpoint of the user in the Y direction.

An opening to be described later (FIG. 9) is formed in the lower surface of the housing 106, and the video light from the video display apparatus 1 in the housing 106 is emitted downward through the opening. Note that, in the following examples, for example, the configuration illustrated in FIG. 6 can be similarly applied as the video display apparatus 1, and detailed description thereof will be omitted.

The video display apparatus 1, the beam splitter 101, the retroreflector 2, and the like are arranged and fixed so as to have a predetermined positional relationship or the like as in the Z-shape configuration in FIG. 3. First, the beam splitter 101 is connected and arranged on the lower side of the housing 106 via the support column 108. Then, the retroreflector 2 (in particular, far side) and the λ/4 plate 21 are connected and arranged to the beam splitter 101 (in particular, lower side) via the support column 108. For example, four sides of a rectangle of each of the beam splitter 101 and the retroreflector 2 are bonded and fixed to 0.30 the corresponding support column 108. As illustrated in the drawing, the air floating video 3 is formed at a predetermined position on the front side of the beam splitter 101 in the Y direction.

Note that, in FIG. 7 and the like, for easy understanding of the shape and the arrangement of the retroreflector 2 and the like, the surfaces of the retroreflector 2 and the like are illustrated as if they are opened and inclined slightly downward with respect to the upper and lower surfaces of the housing 106, but actually, as illustrated in FIG. 10 to be described later, the upper and lower surfaces of the housing 106 (corresponding video display apparatus 1) and the main surfaces of the retroreflector 2 and the like are substantially parallel to each other. Furthermore, the beam splitter 101 is arranged with an oblique inclination of, for example, about 45 degrees with respect to these.

First Example (2)

Figure 8:
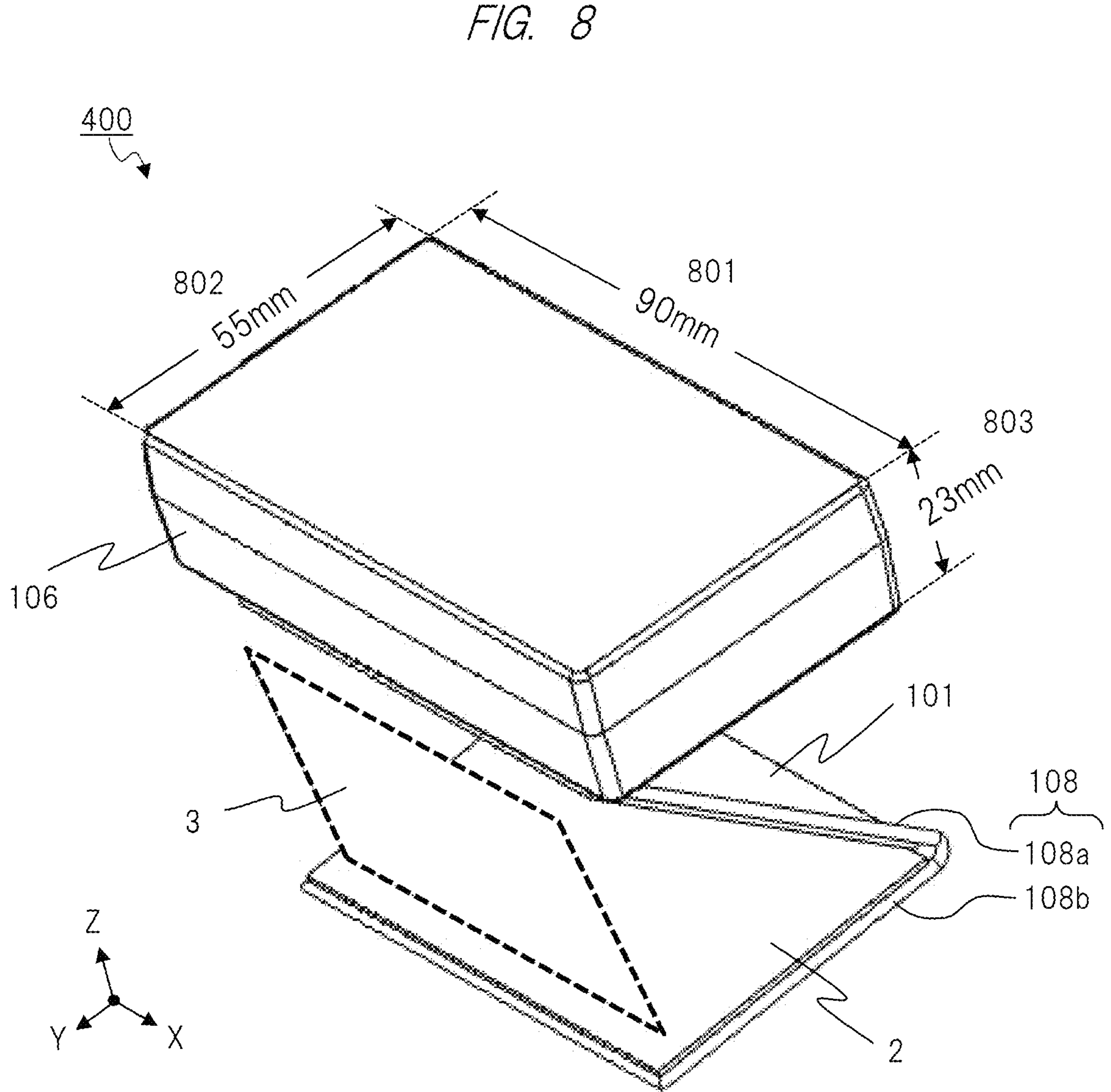
FIG. 8 is a perspective view illustrating an external configuration example of an air floating video display in the in-vehicle air floating video display apparatus according to the example.

FIG. 8 illustrates an external configuration example in a case where the air floating video display 400 in FIG. 7 is viewed obliquely from an upper side (in particular, upper right). The housing 106 has a substantially rectangular parallelepiped shape. It is necessary to store the video display apparatus 1 including the light source apparatus 13 and the liquid crystal display panel 11 described above in the housing 106. In the present example, a liquid crystal display apparatus of approximately three inches is adopted as the liquid crystal display panel 11. Correspondingly, in the present example, the housing 106 has a shape and dimensions as illustrated in the drawing. As to the dimensions and the shape of the thin housing 106, when viewed from the side of the air floating video 3 (Y direction), a width 801 (size in X direction) is 90 mm, a depth 802 (size in Y direction) is 55 mm, and a thickness 803 (size in Z direction) is 23 mm.

As will be described later, in the air floating video display apparatus according to the present example, an upper surface portion of the housing 106 is fixed to a ceiling portion in the vehicle. Therefore, it is desirable that the housing 106 has a thin shape to such an extent that the presence of the housing 106 is not noticeable as possible when viewed from a driver and other passengers. Furthermore, the housing 106 needs to store the video display apparatus 1 including the light source apparatus 13 and the liquid crystal display panel 11 and further secure a space for dissipating heat generated from the light source apparatus 13. In consideration of these, the thickness 803 of the housing 106 is set to 23 mm in the present example.

First Example (3)

Figure 9:
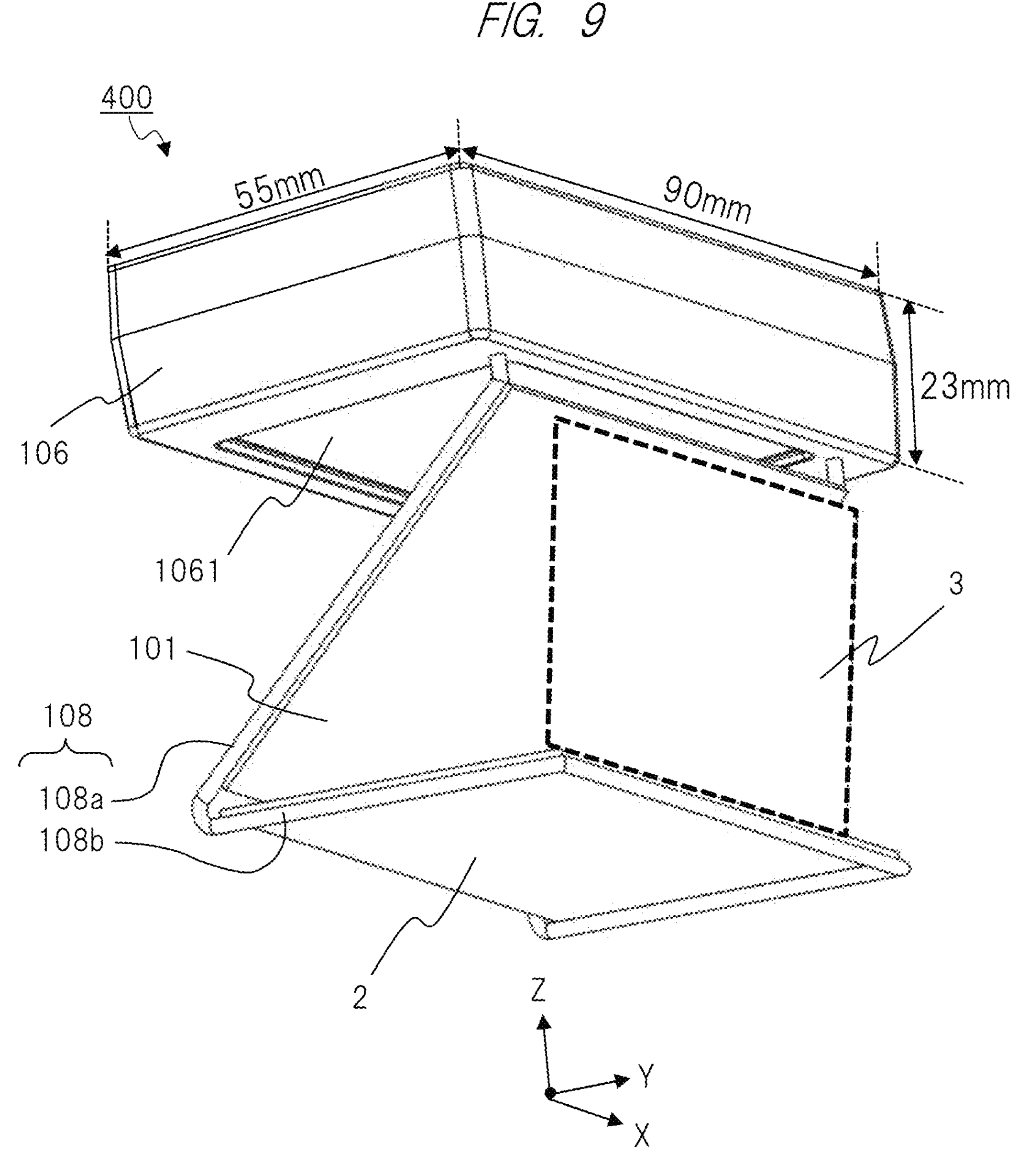
FIG. 9 is a perspective view illustrating an external configuration example of the air floating video display in the in-vehicle air floating video display apparatus according to the example.

FIG. 9 illustrates an external configuration example in a case where the air floating video display 400 in FIG. 7 is viewed obliquely from a lower side (in particular, lower left). As illustrated in FIG. 9, an opening 1061 is provided in the lower surface of the housing 106 so as to emit the video light of the liquid crystal display panel 11 (FIG. 10 described later) toward the beam splitter 101. The opening 1061 may be a simple opening, but the transparent member 100 such as a glass plate may be provided as in FIG. 3.

As illustrated in the drawing, on the lower surface of the housing 106, the support column 108 protrudes downward from two corners located on the front side in the Y direction. The support column 108 obliquely extends downward first, and four sides (at least left and right two sides) of the support column 108 (in particular, support column 108*a*) support and fix corresponding four sides (at least left and right two sides) of the beam splitter 101. Moreover, the support column 108 (in particular, support column 108*b*) extends from the lower end of the support column 108 (in particular, support column 108*a*) toward the front side in the Y direction. The four sides (at least left and right two sides) of the support column 108 (in particular, support column 108*b*) support and fix corresponding four sides (at least left and right two sides) of the retroreflector 2 and the λ/4 plate 21. In this example, the support column 108*b* supports and fixes the three sides of the retroreflector 2 including the side on the front side by the three sides including the side on the front side.

The support column 108 (108*a*, 108*b*) described above has rigidity to such an extent to be able to stably support the beam splitter 101, the retroreflector 2, and the like. Note that, as long as the support column 108 can stably support the beam splitter 101, the retroreflector 2, and the like, it is not always necessary to support the beam splitter 101 and the like by all of the four sides, and the support column 108 may support the beam splitter 101 and the like by, for example, the two or three sides.

First Example (4)

FIG. 10 is a cross-sectional view illustrating an internal structure of the air floating video display 400 in FIG. 7 to FIG. 9 viewed from a side surface in the X direction (direction A in FIG. 7). As illustrated in the drawing, the air floating video display 400 has the Z-shape configuration in FIG. 3. In a case where the configuration in FIG. 3 is rotated in the drawing such that a direction D in FIG. 3 is set to be the vertical direction (Z direction), the configuration in FIG. 3 is similar to the configuration in FIG. 10, except for the transparent member 100 and the like.

In FIG. 10, the video display apparatus 1 stored in the housing 106 is arranged in such a direction that the video light from the liquid crystal display panel 11 is emitted downward in the Z direction. Namely, the video display surface of the liquid crystal display panel 11 is arranged on an X-Y plane (horizontal plane). In the housing 106, the light source apparatus 13, the liquid crystal display panel 11, and the absorption-type polarization plate 12 are arranged in this order from the top. In FIG. 10, the video light emitted from the video display apparatus 1 downward on an optical axis C1 via the opening 1061 is indicated by a broken line arrow. The center broken line arrow of the three broken line arrows indicates an optical axis, and broken line arrows on the left and right sides indicate a range of a light flux.

The video light emitted from the liquid crystal display panel 11 is assumed as a light having predetermined polarization characteristics, for example, P polarization (parallel polarization: P is abbreviation of parallel). The video light of the P polarization directly passes through the beam splitter 101 downward, and travels toward the retroreflector 2 on an optical axis C2 corresponding to the optical axis C1. The beam splitter 101 has a property y of transmitting the video light of P polarization and reflecting the video light of S polarization (vertical polarization: S is abbreviation of senkrecht). The beam splitter 101 is arranged so as to form an angle of, for example, about 45 degrees with the video light of P polarization (optical axis C1, Z direction). Namely, the beam splitter 101 is arranged such that the main surface forms an angle of about 45 degrees with respect to the Y direction of the main surfaces of the liquid crystal display panel 11 and the retroreflector 2.

On the other hand, the λ/4 plate 21 is provided on the light incident surface of the retroreflector 2. The video light of P polarization from the video display apparatus 1 on the optical axis C2 that has passed through the beam splitter 101 is subjected to polarization conversion from the P polarization to the S polarization, by passing through the λ/4 plate 21 twice in total before being reflected by the retroreflector 2 and after being reflected by the retroreflector 2. As a result, the video light of S polarization that has traveled on the optical axis C2 after being reflected by the retroreflector 2 is reflected by the beam splitter 101, travels on an optical axis C3 in the Y direction, and generates and displays the air floating video 3 that is a real image, at a predetermined position on the front side in the Y direction as illustrated in the drawing. In the present example, the position where the air floating video 3 is formed is set to a position near an end portion of a region of the main surface of the retroreflector 2 on the front side in the depth direction (Y direction). The predetermined position is adjustable by design. As described above, in the present example, the air floating video 3 is generated by the linearly-polarized video light (video light of S polarization in the present example). The user can favorably visually recognize the air floating video 3 from the front side in the Y direction.

In the example described above, the video display apparatus 1, the beam splitter 101, and the retroreflector 2 maintain the Z-shape positional relationship as illustrated in FIG. 10, and can provide the air floating video 3 with good visibility to the observer.

Modification

Here, as is well known, the S-polarized video light cannot be visually recognized when the observer wearing polarization sunglasses observes the S-polarized (linearly-polarized) video light. This is because the polarization sunglasses transmit only the linearly-polarized light, generally, P-polarized light and cannot transmit the S-polarized light. As a result, in the case of the example described above, the observer (driver) wearing the polarization sunglasses cannot observe the air floating video 3.

Figure 11:
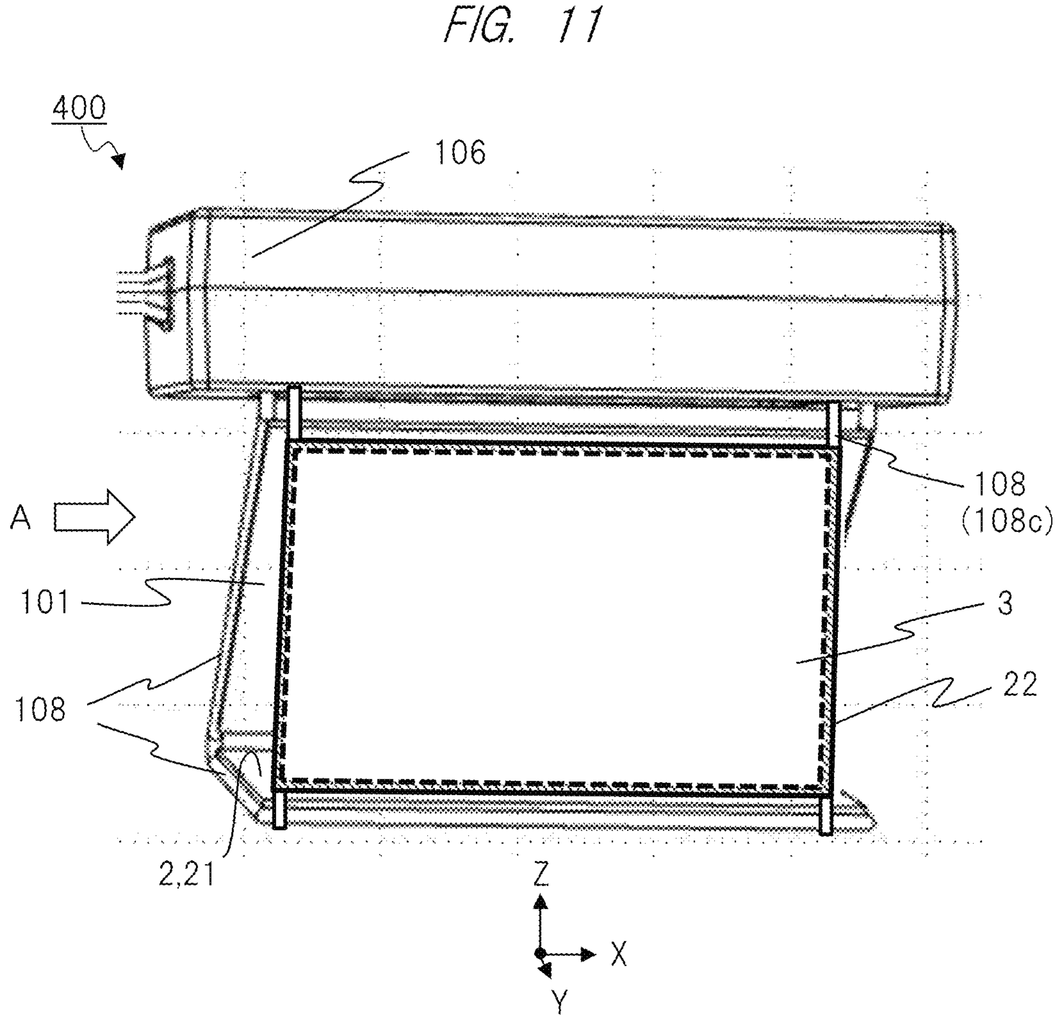
FIG. 11 is a diagram illustrating an external configuration example of an air floating video display seen from a front side in an in-vehicle air floating video display apparatus according to a modification.
Figure 12:
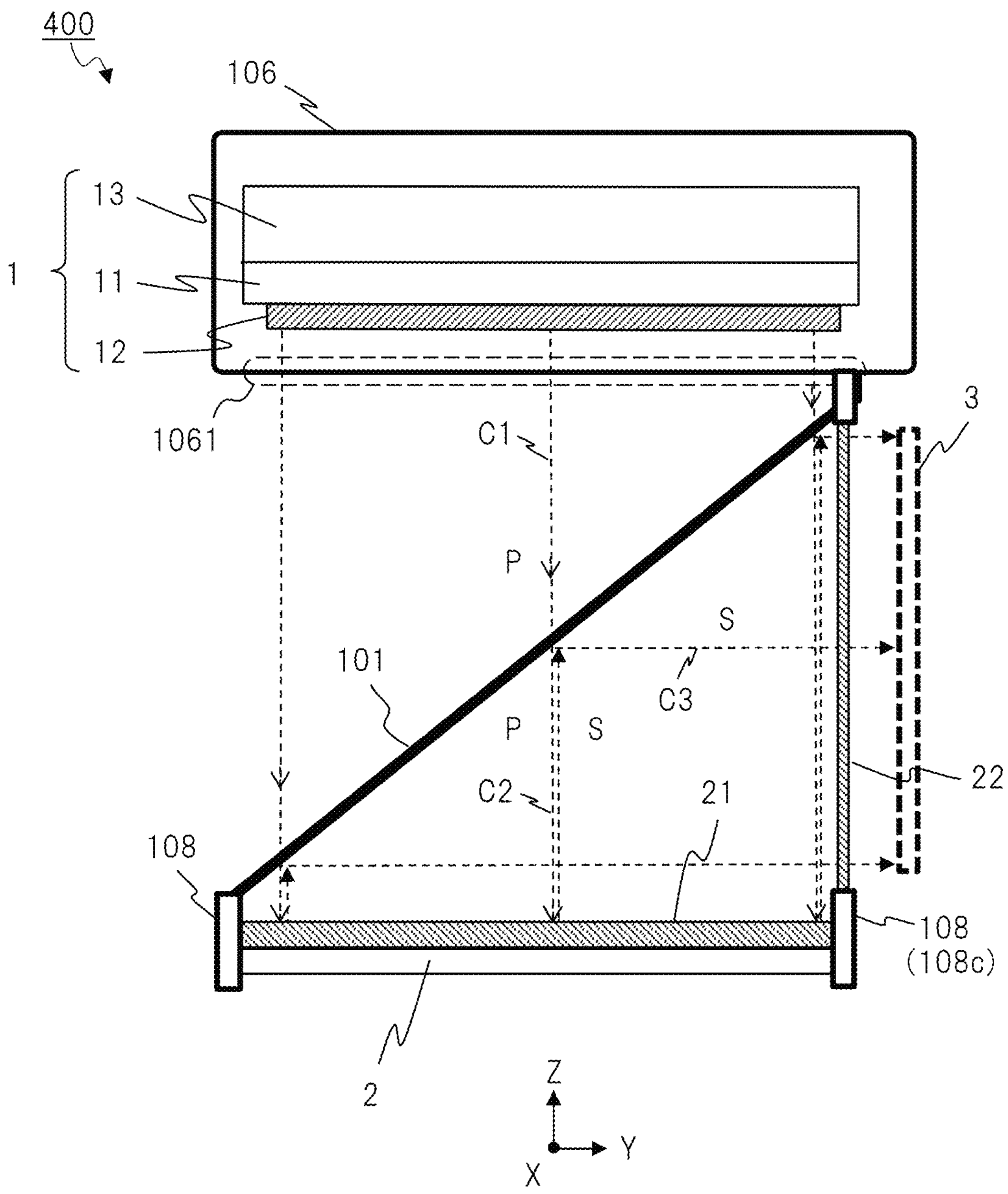
FIG. 12 is a diagram illustrating a configuration example of the air floating video display in a cross section seen from a side in the in-vehicle air floating video display apparatus according to the modification.

Then, a modification that can suitably cope with the case where the observer (driver) wearing the polarization sunglasses observes the air floating video 3 will be described below. FIG. 11 and FIG. 12 illustrate a configuration of an air floating video display apparatus according to the modification. FIG. 11 is a diagram of an air floating video display 400 according to the modification viewed from the front side, and FIG. 12 is a diagram of the air floating video display 400 according to the modification viewed from the side (direction A).

As illustrated in FIG. 11 and FIG. 12, in this modification, a λ/4 plate 22 that is a second λ/4 plate is arranged at a position between the front side of the beam splitter 101 in the Y direction and a predetermined position where the air floating video 3 is formed, for example, a position just behind the predetermined position where the air floating video 3 is formed. The λ/4 plate 22 has a property of converting linearly-polarized video light into circularly-polarized video light. Namely, in this modification, the video light of S polarization (linearly-polarized video light) after being reflected by the beam splitter 101 is converted into the circularly-polarized video light by passing through the λ/4 plate 22, and the air floating video 3 by the circularly-polarized video light is formed at the predetermined position. As a result, the air floating video 3 can be visually recognized even in the case where the user (driver) wearing the polarization sunglasses observes the air floating video 3.

The λ/4 plate 22 is supported by the support column 108 (in particular, support column 108*c*) protruding downward from the position on the lower surface of the housing 106 on the front side in the Y direction and the support column 108 (in particular, support column 108*c*) protruding upward from the position on the front side of the retroreflector 2 in the Y direction. The support column 108*c* described above may be the support column extending the lower surface of the housing 106 to the retroreflector 2. At least four corners of a rectangle of a main surface of the λ/4 plate 22 are supported by the support column 108*c*. Other than that described above, the left and right two sides or the four sides of the λ/4 plate 22 may be supported by the support column 108*c*.

[Support Column]

As described in the examples illustrated in FIG. 7 and subsequent drawings, the components such as the beam splitter 101 and the retroreflector 2 used to generate and display the air floating video 3 are supported and fixed to the lower side of the housing 106 so as to be suspended by the support column 108. For example, in the example in FIG. 7 to FIG. 10, the main surface of the beam splitter 101 is rectangular, and the support column 108 (in particular, support column 108*a*) has a shape that supports at least left and right two sides of the edges of the four sides of the beam splitter 101. Furthermore, the main surface of the retroreflector 2 is also rectangular, and the support column 108 (in particular, support column 108*b*) has a shape that supports at least left and right two sides of the edges of the four sides of the retroreflector 2.

The support column 108 is a support, a support member, or a support tool having a columnar shape, a bar-like shape, an elongated long plate shape, or the like, in other words, a fixing portion or a suspension. The support column 108 is a member, a tool, or a mechanical structure that supports and fixes the beam splitter 101 and the retroreflector 2 so as to be suspended on the lower side of the housing 106.

As a material of the support column 108, metal such as aluminum or iron, resin, or the like can be used. It is preferable that the sense of floating in the air of the air floating video 3 is made conspicuous and the components other than the air floating video 3 are not noticeable as possible when the user visually recognizes the air floating video 3. Therefore, the support column 108 is not formed as a housing that covers the beam splitter 101 and the like, and is formed to have, for example, a columnar shape so as to minimize a volume while securing rigidity and strength for support.

Furthermore, it is desirable that the support column 108 is so-called matte finished so as not to deteriorate the visibility of the air floating video 3 due to reflection of external light or the like on the support column 108. Namely, it is assumed that the surface of the support column 108 has a property of preventing and suppressing external light reflection (light shielding property).

Furthermore, it is desirable that the support column 108 is less noticeable in order to make the sense of floating in the air of the air floating video 3 more conspicuous. In that case, the support column 108 may be made of a material having a property close to transparent (light transmissive property), for example, light transmissive resin.

[Configuration Example Related to Support Column]

Figure 13:
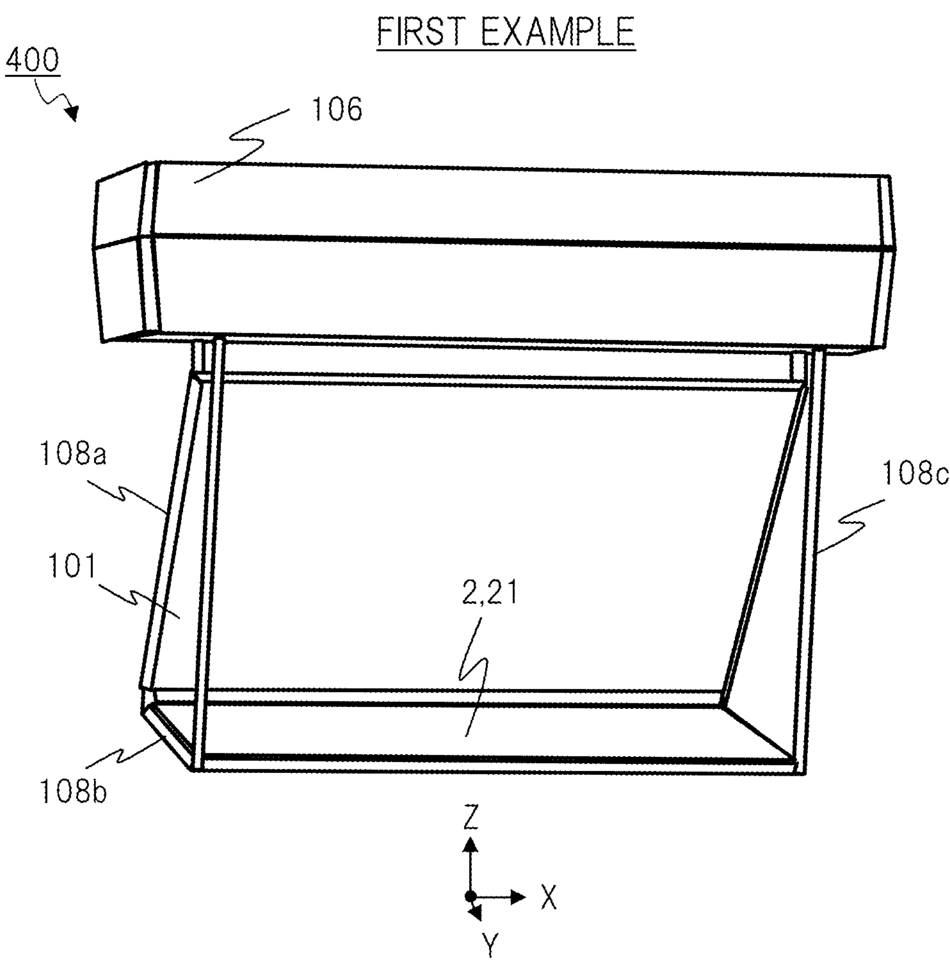
FIG. 13 is a diagram illustrating a configuration example (first example) related to a support column as a modification.

The configuration in which the beam splitter 101 and the retroreflector 2 are supported by the support column 108 is not limited to the above example and the like, and various modifications can be made as follows. FIG. 13 and subsequent drawings illustrate modifications (first example to eighth example) related to the support column 108. In the following modifications, configurations in the case where a mechanical strength for supporting the beam splitter 101 and the retroreflector 2 is further enhanced by mainly increasing the number of support columns 108 will be described. As a result, for example, it is possible to realize the configuration in which a change in the position of the air floating video 3 due to shake or vibration at the time when the vehicle travels is small. Namely, it is possible to provide the air floating video 3 with less video blurring and good visibility to the driver. Note that, in FIG. 13 and subsequent drawings, for easy understanding of the structure, illustration of the display position of the air floating video 3 is omitted in some cases.

First Example

FIG. 13 illustrates a first example related to the support column 108. The first example is similar to the modification in FIG. 11 and FIG. 12. However, in the configuration of the first example, support columns 108*c* each extending in the Z direction from the positions at the right and left ends of the retroreflector 2 on the foremost side in the Y direction to the corresponding positions of the housing 106 are added. As a result, the retroreflector 2 is supported not only by the support column 108*b* via the support column 108*a* of the beam splitter 101 but also by the support columns 108*c*. Therefore, the overall strength can be increased.

Note that, in the support column 108*a* of the beam splitter 101 and the support column 108*b* of the retroreflector 2, a common support column may be provided for a portion of the side where the beam splitter 101 and the retroreflector 2 are connected as illustrated in FIG. 13, or no support column may be provided for that portion.

Second Example

Figure 14:
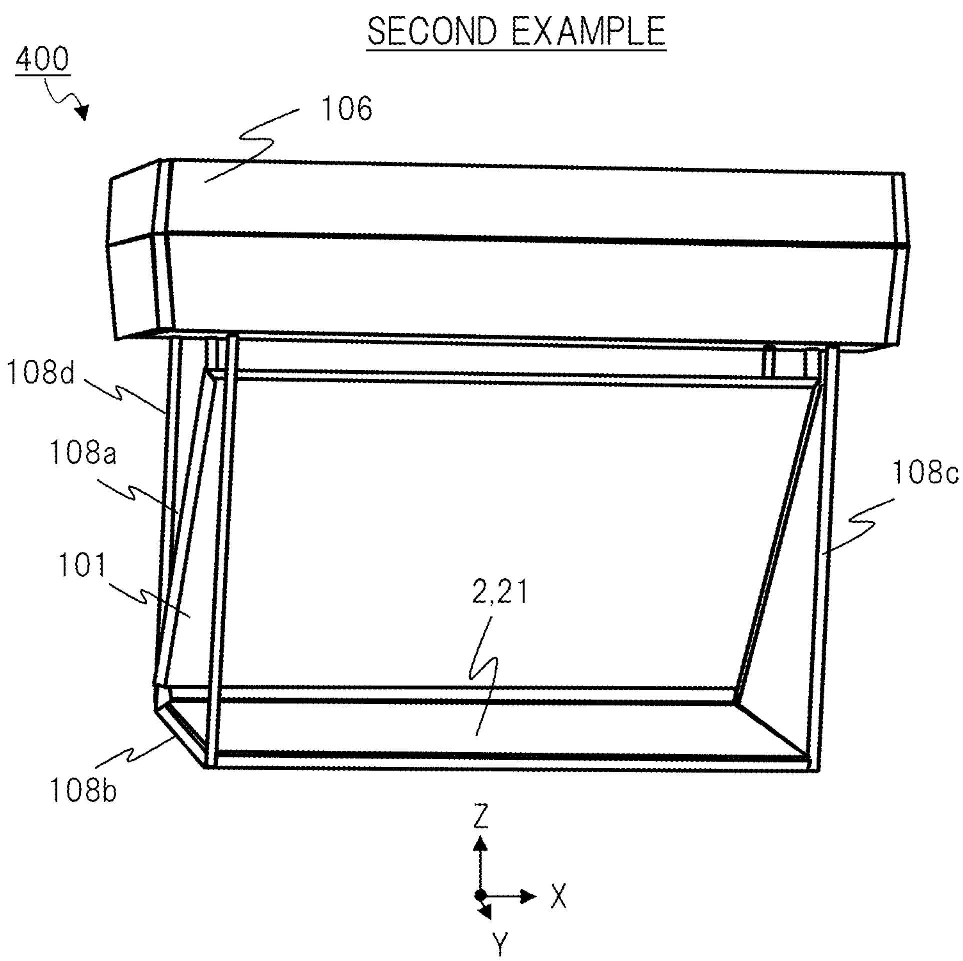
FIG. 14 is a diagram illustrating a configuration example (second example) related to the support column as a modification.

FIG. 14 illustrates a second example related to the support column 108. In the configuration of the second example, support columns 108*d* are each added at the positions at the right and left ends of the retroreflector 2 on the rearmost side in the Y direction, in addition to the configuration of the first example. The beam splitter 101 and the retroreflector 2 are supported not only by the support columns 108*a* and 108*b* but also by the support columns 108*c* and 108*d*. As a result, the overall strength can be increased.

Third Example

Figure 15:
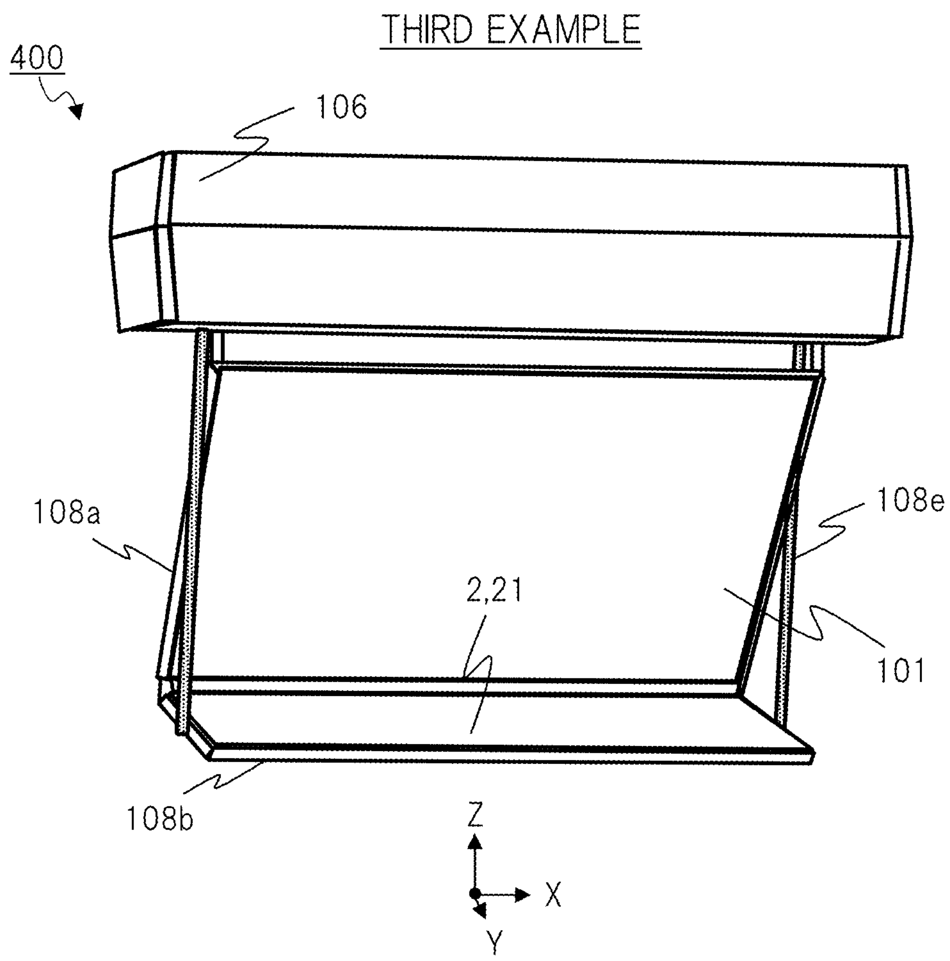
FIG. 15 is a diagram illustrating a configuration example (third example) related to the support column as a modification.

FIG. 15 illustrates a third example related to the support column 108. In the configuration of the third example, support columns 108*e* each extending in the Z direction between the lower surface of the housing 106 and positions near the Y direction center of the left and right sides of the retroreflector 2 in the X direction are added, in addition to the support columns 108*a* and 108*b* described above. The support column 108*e* is also connected to a part of the support columns 108*a* and 108*b*. The beam splitter 101 and the retroreflector 2 are supported not only by the support columns 108*a* and 108*b* but also by the support columns 108*e*. As a result, the overall strength can be increased.

Fourth Example

Figure 16:
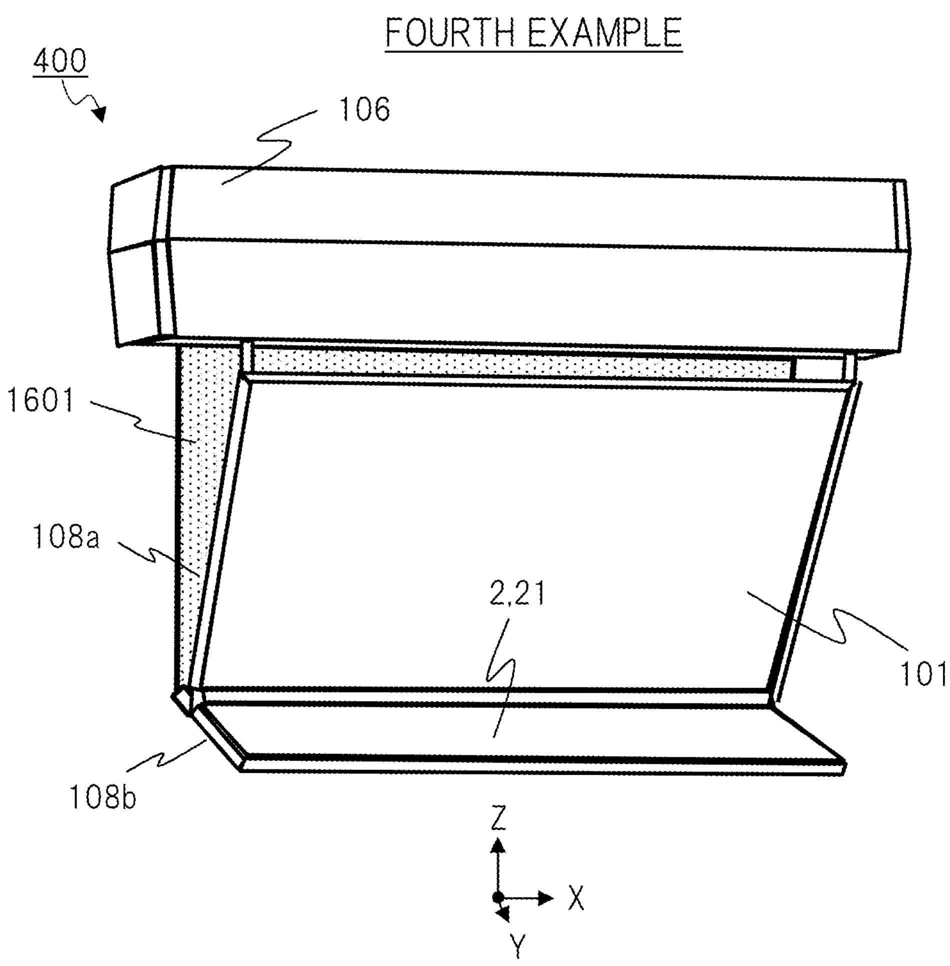
FIG. 16 is a diagram illustrating a configuration example (fourth example) related to the support column as a modification.

FIG. 16 illustrates a fourth example related to the support column 108. In the configuration of the fourth example, a wall 1601 (in other words, support plate) made of a transparent member (for example, acrylic plate) is installed behind the beam splitter 101 and at a rearmost position in the Y direction between the lower surface of the housing 106 and the retroreflector 2, instead of adding a support column. This wall 1601 has a main surface in the X-Z plane, and a lower side of the main surface is connected to a lower side of the support column 108*a* of the beam splitter 101. This wall 1601 has a flat plate shape instead of a columnar shape, but functions as a member for supporting the beam splitter 101 and the retroreflector 2 like the support column 108. With this configuration, the beam splitter 101 and the retroreflection plate 2 can be more stably supported than the configuration in FIG. 7, and the overall strength can be increased.

Furthermore, since the wall 1601 is a transparent member in the case of the fourth example, the beam splitter 101 and the wall 1601 are not so noticeable when the user views the air floating video display 400. Note that, in a case where the air floating video display apparatus is not used, since the beam splitter 101 is semi-transparent and the wall 1601 is transparent, the user can visually recognize a front landscape through them to some extent when the user views the air floating video display 400.

Fifth Example

Figure 17:
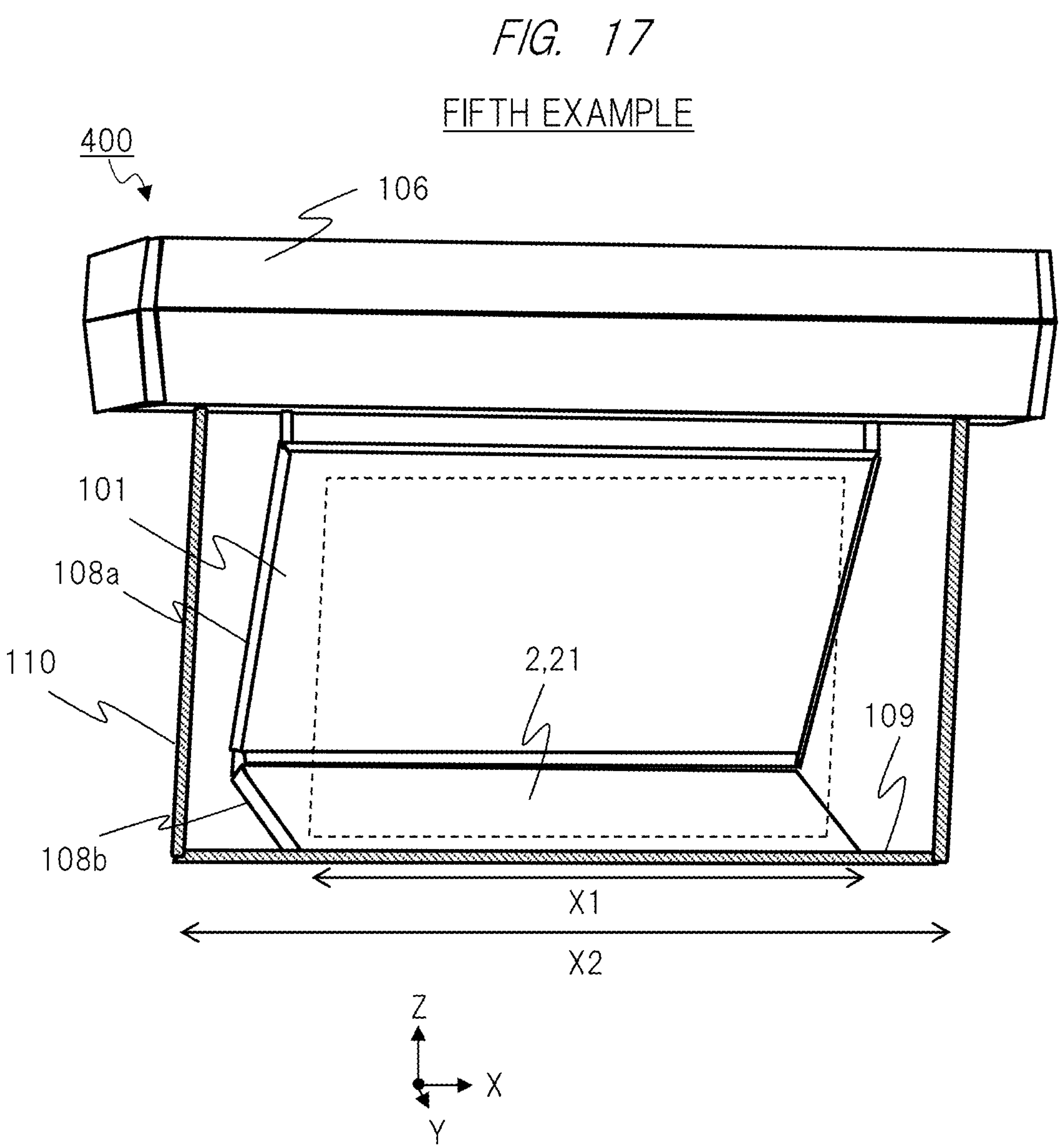
FIG. 17 is a diagram illustrating a configuration example (fifth example) related to the support column as a modification.

FIG. 17 illustrates a fifth example related to the support column 108. In the fifth example, a support column 109 (indicated by oblique hatching) is added, in addition to the configuration of the support column 108 (108*a*, 108*b*) in FIG. 7 described above. In this configuration, first, the support column 109 (horizontal support column) is provided at the position of the foremost side of the retroreflector 2 in the Y direction. A width (X2) of the support column 109 in the X direction is longer than a width (X1) of the retroreflector 2 in the X direction (X1<X2). In this example, the support column 108*b* of the retroreflector 2 is present on each of the left and right sides of the retroreflector 2, and the support column 109 is provided on the side on the front side. Moreover, support columns 110 (vertical support columns) extending in the Z direction that is the vertical direction are provided from positions at the left and right ends of the support column 109 in the X direction to the lower surface of the housing 106. The support column 109 is connected to the side of the retroreflector 2 on the front side, and the support column 110 is connected to the support column 109 and the housing 106. The beam splitter 101 and the retroreflector 2 are supported not only by the support columns 108*a* and 108*b* but also by the support columns 109 and 110. As a result, the overall strength can be increased.

Furthermore, since the distance between the left and right two support columns 110 is larger than the width (X1) of the retroreflector 2 in the configuration of the fifth example, the left and right two support columns 110 are located at slightly separated positions from the air floating video 3 (position thereof is indicated by broken line frame) in the X direction. As a result, it is possible obtain the effect that the support column 110 does not interfere (is more unnoticeable) when the driver visually recognizes the air floating video 3.

Sixth Example

Figure 18:
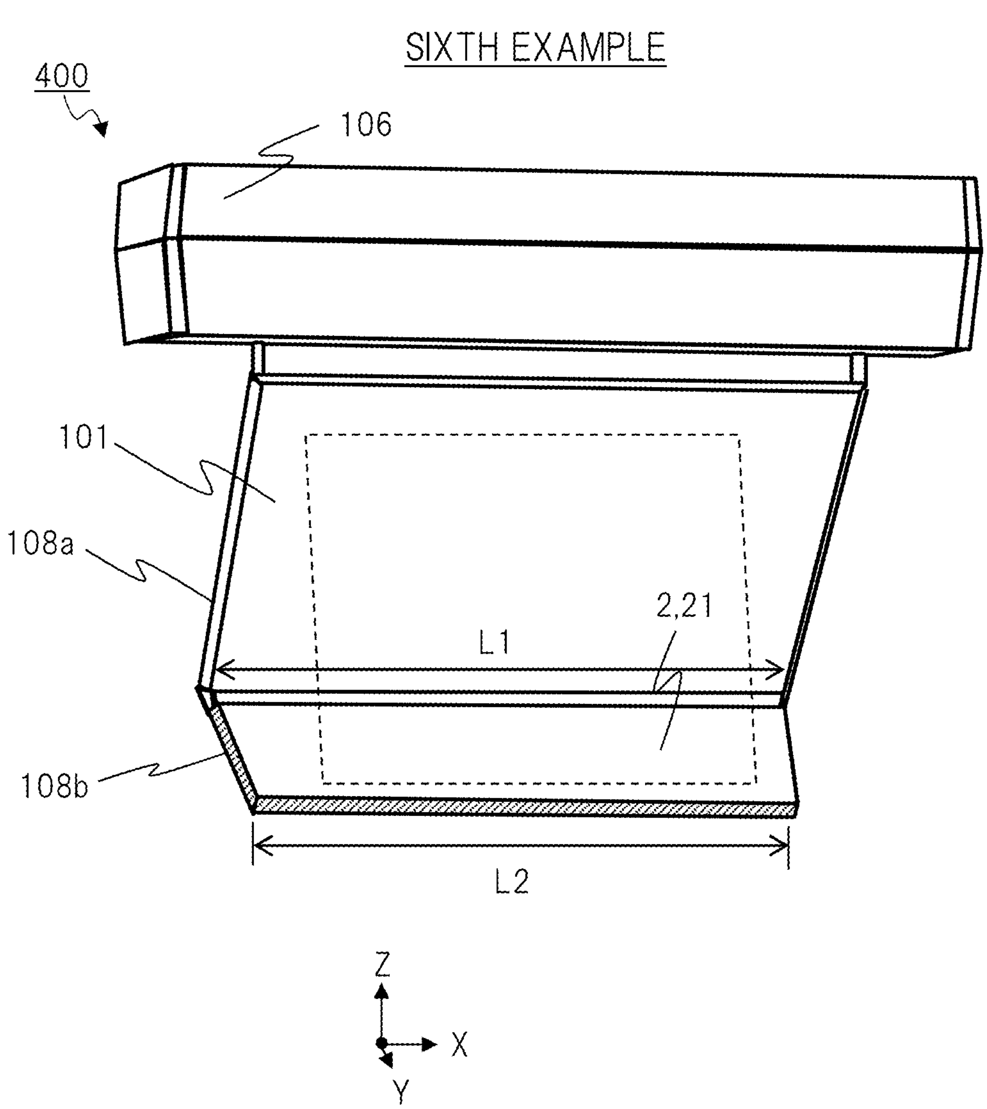
FIG. 18 is a diagram illustrating a configuration example (sixth example) related to the support column as a modification.

FIG. 18 illustrates a sixth example related to the support column 108. In the sixth example, the plate shape of the retroreflector 2 is a trapezoidal shape instead of a rectangular shape. As the trapezoidal shape, a relationship between a length L1 of a side of the retroreflector 2 on a rear side and a length L2 of a side on a front side is L1>L2, and the length L1 of the side on the rear side is longer than the length L2 of the side on the front side. Note that, in FIG. 18, for easy understanding, the retroreflector 2 is illustrated such that the front side thereof is obliquely opened and inclined downward in the Z direction. The support column 108 includes the support column 108*a* that supports the four sides of the beam splitter 101 and the support column 108*b* that supports the four sides of the retroreflector 2 having the trapezoidal shape.

In this configuration, the air floating video 3 has a slightly small shape as indicated by a rectangle of a broken line frame. This is because a lateral width of the air floating video 3 is designed in accordance with the length L2 of the side of the retroreflector 2 on the front side. Therefore, in this configuration, when the driver observes the air floating video 3, the support column 108 (108*a*, 108*b*) is not viewed as overlapping the air floating video 3 even if a viewpoint of the driver (angle of vision) deviates to the left or right to some extent in the X direction (for example, about +10 degrees). In this respect, it is possible to provide the air floating video 3 with good visibility.

Seventh Example

Figure 19:
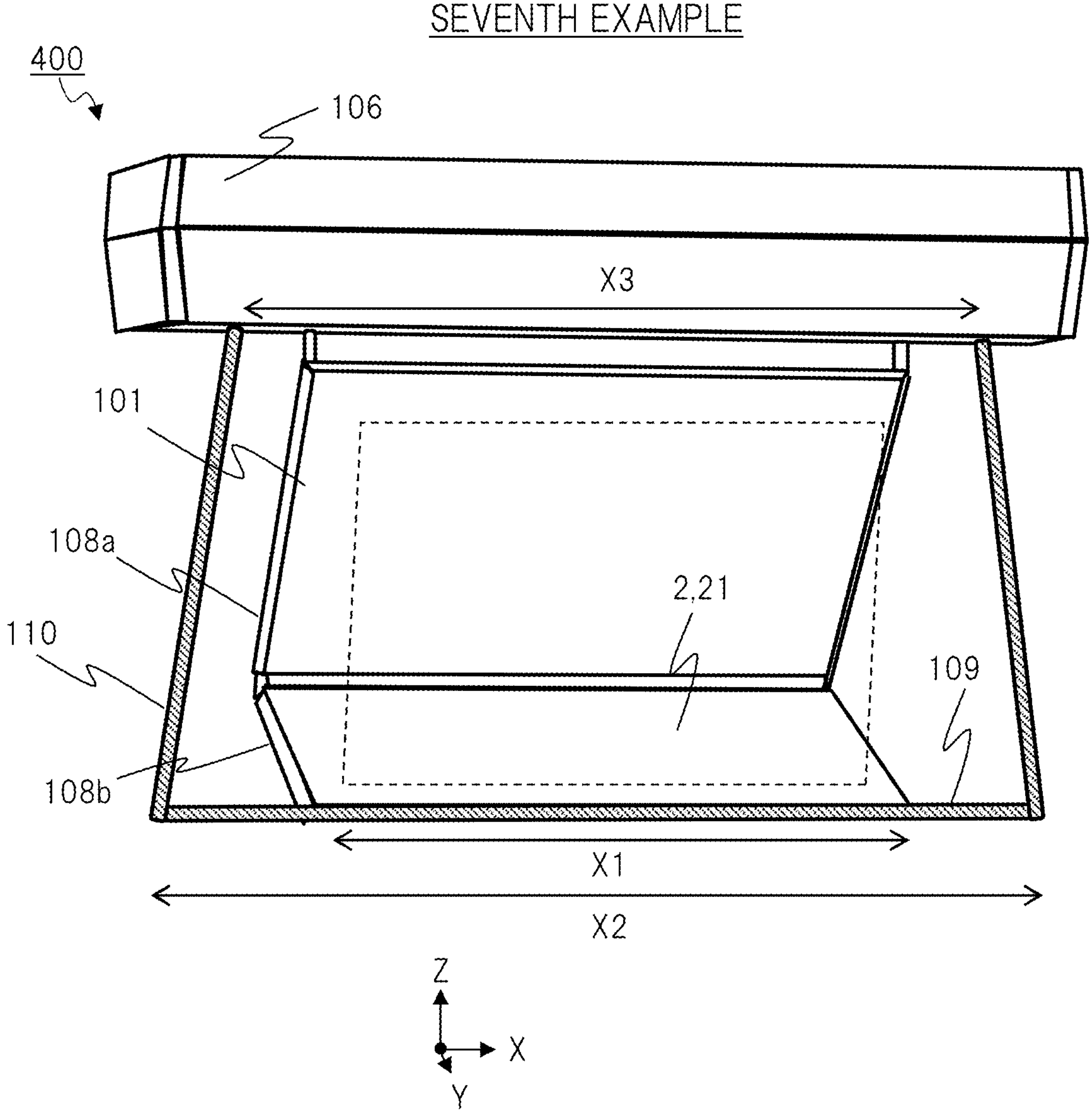
FIG. 19 is a diagram illustrating a configuration example (seventh example) related to the support column as a modification.

FIG. 19 illustrates a seventh example related to the support column 108. The seventh example is similar to the fifth example in FIG. 17 and includes the support columns 109 and 110 in addition to the support columns 108*a* and 108*b*. In the seventh example, first, the width (X2) of the support column 109 that supports the foremost position of the retroreflector 2 (side on front side) in the Y direction is longer than the width (X1) of the retroreflector 2. Further, the support columns 110 attached at the positions of both of the left and right ends of the support column 109 extend in a slightly oblique direction toward the center in the X direction instead of extending toward the housing 106 in the vertical direction. Accordingly, regarding the width in the X direction between the right and left two support columns 110, the width (X2) on the lower side close to the retroreflector 2 is larger than a width (X3) on the upper side close to the housing 106. In other words, an opening formed by the lower surface of the housing 106 and the support columns 109 and 110 has a trapezoidal shape whose upper side is shorter as illustrated in the drawing. As a result, in the configuration of the seventh example, as in the fifth example in FIG. 17, the support column 110 does not overlap the air floating video 3 even if the viewpoint (angle of vision) of the driver deviates to the left or right to some extent (for example, about +10 degrees). In this respect, it is possible to provide the air floating video 3 with good visibility.

Eighth Example

Figure 20:
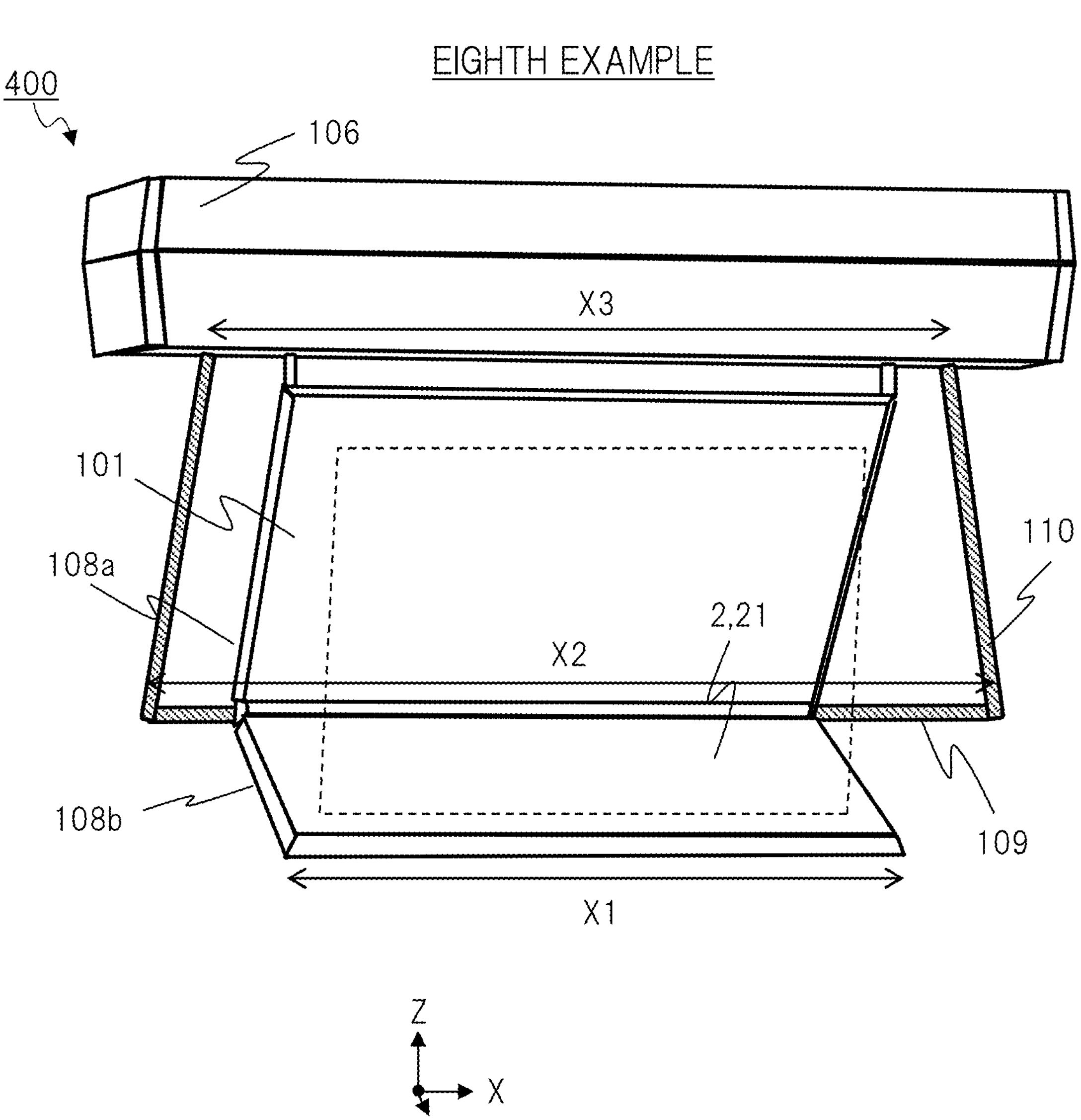
FIG. 20 is a diagram illustrating a configuration example (eighth example) related to the support column as a modification.

FIG. 20 illustrates an eighth example related to the support column 108. The eighth example is similar to the seventh example in FIG. 19, and the support columns 109 and 110 are provided at positions on the rear side in the Y direction. The width (X2) of the support column 109 that supports the rearmost position of the retroreflector 2 in the Y direction is longer than the width (X1) of the retroreflector 2. The support columns 110 attached between both of the left and right ends of the support column 109 and the housing 106 extend in the slightly oblique direction toward the center in the X direction. Regarding the width in the X direction between the support columns 110, the width (X3) on the upper side is narrower than the width (X2) on the lower side. Also in this configuration, as in the seventh example in FIG. 19, the support column 110 does not overlap the air floating video 3 even if the viewpoint (angle of vision) of the driver deviates to the left or right to some extent (for example, about +10 degrees). In this respect, it is possible to provide the air floating video 3 with good visibility.

Other than the modifications related to the support column 108 illustrated in FIG. 13 to FIG. 20 above, for example, a mode in which the configurations of the respective modifications are combined is also possible. For example, the support columns (109 and 110) may be provided on both of the front and the rear sides in the Y direction in the mode in which the seventh example in FIG. 19 and the eighth example in FIG. 20 are combined.

<Installation Example (1) of In-Vehicle Air Floating Video Display Apparatus>

Figure 21:
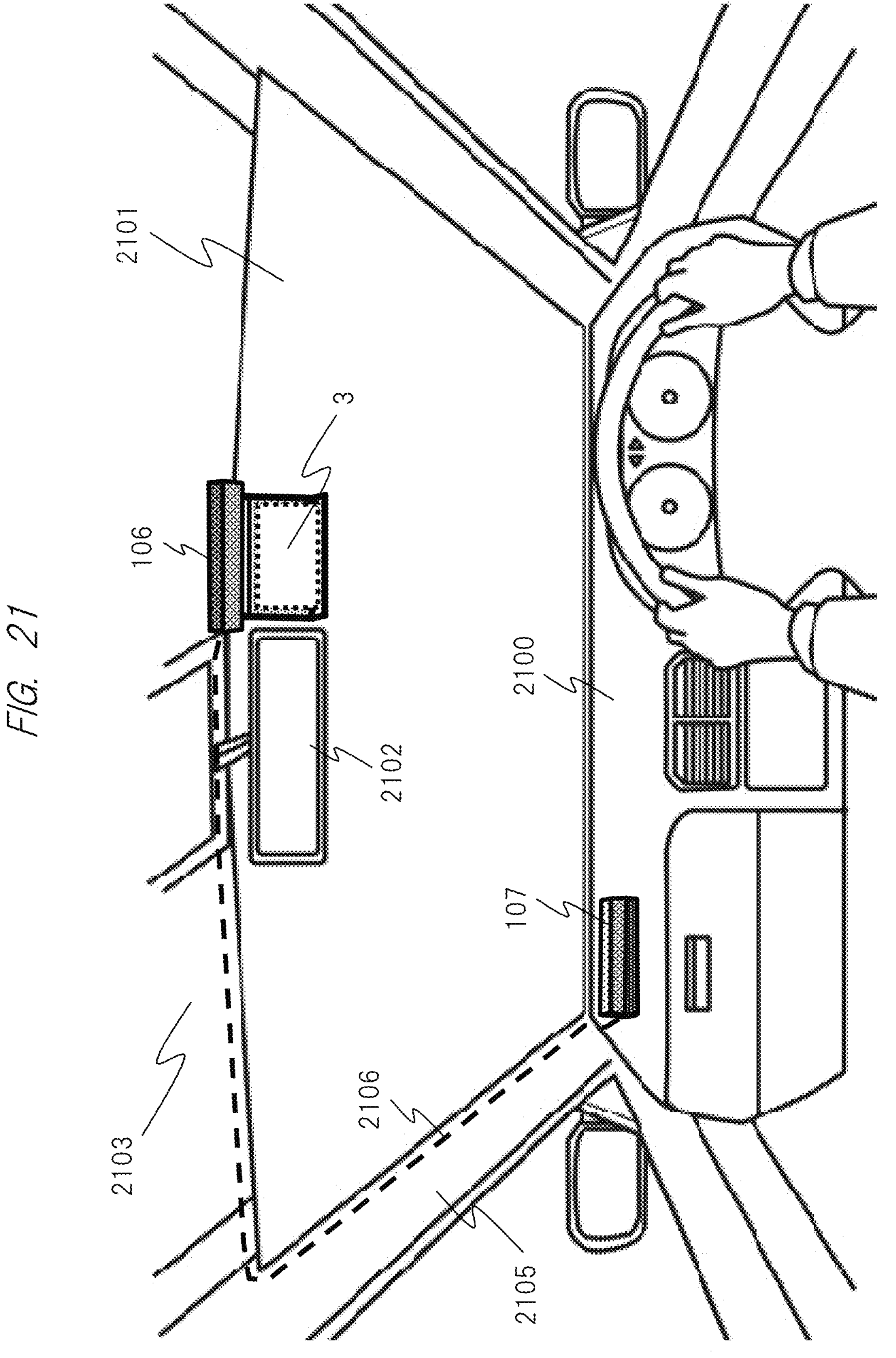
FIG. 21 is a diagram illustrating an installation example (first installation example) of the in-vehicle air floating video display apparatus according to the example.

FIG. 21 illustrates an installation example (first installation example) of the in-vehicle air floating video display apparatus in FIG. 7 and subsequent drawings. FIG. 21 schematically illustrates a case where a driver at a right steering wheel position views a windshield 2101 or the like on a front side in the vehicle. In the first installation example in FIG. 21, the housing 107 of the video controller 300 in the example in FIG. 7 is arranged on a left side on a dashboard 2100. Furthermore, the air floating video display 400 is arranged near a ceiling portion 2103 in the vehicle so as to be located on a right side of a rearview mirror 2102 (in other words, driver's mirror) near the center in the lateral direction. In FIG. 21, an example in which the air floating video 3 is displayed on the right side of the rearview mirror 2102 by the air floating video display 400 is illustrated. The housing 106 is arranged and fixed at a predetermined position near the rearview mirror 2102 or the ceiling portion 2103. In the first installation example, the housing 106 (in particular, upper surface) in which the video display apparatus 1 is stored is fixed to the ceiling portion 2103 in the vehicle.

The housing 107 of the video controller 300 is arranged at any position on the dashboard 2100, for example, at a left corner position so as to be less noticeable (not to interfere) for the driver at the right steering wheel position. The housing 107 is not limited to be arranged on the dashboard 210, and may be installed in a place where the driver or the passenger cannot see the housing 107, for example, in the glove compartment or the like. As the cable 105 connecting the video controller in the housing 107 and the video display apparatus 1 in the housing 106, for example, a wiring 2106 is laid through an inside of an A pillar 2105 and an inside of the ceiling portion 2103 as indicated by a broken line in FIG. 21. In this way, the wiring 2106 can be laid while keeping the cable 105 from being noticeable.

Depending on the installation of the air floating video display apparatus, a direction of the air floating video display 400, that is, a direction of the air floating video 3 (direction of optical axis) is not limited to the horizontal direction and can be adjusted in accordance with a viewpoint position and a line-of-sight direction of the driver. For example, the entire air floating video display 400 may be installed on a ceiling surface of the ceiling portion 2103 so as to face slightly downward. The housing 106 may be fixed to the ceiling portion 2103 via a fixing tool.

<Installation Example (2) of In-Vehicle Air Floating Video Display Apparatus>

Figure 22:
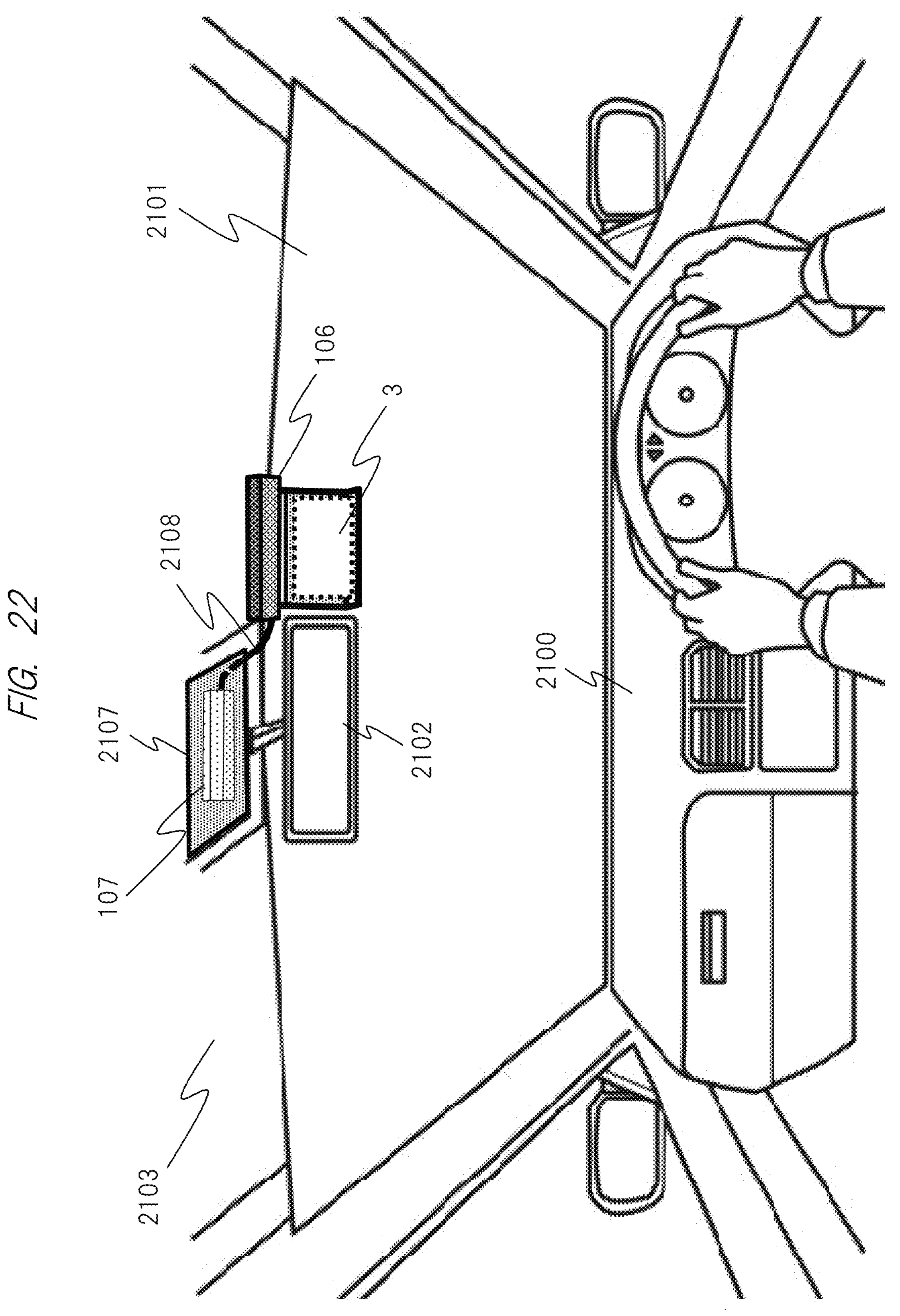
FIG. 22 is a diagram illustrating another installation example (second installation example) of the in-vehicle air floating video display apparatus according to the example.

Similarly, FIG. 22 illustrates another installation example (second installation example) of the in-vehicle air floating video display apparatus. As in FIG. 21, in the second installation example, an example in which the air floating video display 400 is arranged and the air floating video 3 is displayed on a right side of the rearview mirror 2102 as viewed from the driver at the right steering wheel position is illustrated. The housing 106 of the air floating video display 400 is fixed to the ceiling portion 2103 as in FIG. 21. In the second installation example, the housing 107 of the video controller 300 is stored inside an attachment cover 2107 of the ceiling portion 2103 instead of being arranged on the dashboard 2100. The attachment cover 2107 is a portion used to attach the rearview mirror 2102 or the like. A wiring 2108 is laid as the cable 105 between the housings 107 and 106.

According to the second installation example, the wiring 2108 of the cable 105 between the housings 107 and 106 can be shortened. Furthermore, since the housing 107 is not installed on the dashboard 2100, an appearance on the dashboard 2100 is clear.

Effects and the Like

As described above, with the air floating video display apparatus according to the examples and the modifications, it is possible to provide an air floating video display apparatus that is suitable for use in a vehicle and can display an air floating video with high visibility. The air floating video display apparatus according to the examples and the like can be readily installed in vehicles.

In the examples, the air floating video display apparatus is divided into the two housings (housings 107 and 106) and the air floating video display 400 is made compact and lightweight in consideration of arranging the air floating video display apparatus near the ceiling portion 2103 or the rearview mirror 2102 in the vehicle as in FIG. 21 and the like. Furthermore, in order to enhance the sense of floating in the air, in other words, emphasize the air floating video 3 when the air floating video 3 by the air floating video display 400 is visually recognized by the user, the housing 106 is made thin by providing the housing 106 in which the video display apparatus 1 is stored separately from the beam splitter 101 and the retroreflector 2 that are exposed without being covered with the housing or the like. Specifically, the beam splitter 101, the retroreflector 2, and the like are arranged on the lower side of the housing 106 so as to be suspended via the support column 108. Among the components, the video display apparatus 1 is the heaviest, and the beam splitter 101, the retroreflector 2, and the like are relatively light. Therefore, the configuration in which the housing 106 in which the video display apparatus 1 is stored is arranged on the top in the vertical direction and is suspended from the ceiling portion 2103 is adopted. Furthermore, the support column 108, the retroreflector 2, and the like are configured so as to be unnoticeable as possible, as viewed from the user.

When the user uses the in-vehicle air floating video display apparatus according to the examples and the like, for example, a video of a concierge may be displayed as the air floating video 3, and the concierge can give route guidance, POI information, and the like to the driver. In this way, it is possible to provide visually stimulating, more safe and comfortable driving assistance.

In the technique according to the present example, by displaying video information as a high-resolution and high-brightness air floating video in the air floating state, for example, the user can operate without feeling anxious about contact infection of infectious diseases. If the technique according to the present example is applied to a system used by an unspecified number of users, it will be possible to provide a non-contact user interface that can reduce the risk of contact infection of infectious diseases and can eliminate the feeling of anxiety. In this way, it is possible to contribute to “Goal 3: Ensure healthy lives and promote well-being for all at all ages” in the Sustainable Development Goals (SDGs) advocated by the United Nations.

In addition, in the technique according to the present example, only normal reflected light is efficiently reflected with respect to the retroreflector by making the divergence angle of the emitted video light small and aligning the light with a specific polarized wave, and thus a bright and clear air floating video can be obtained with high light utilization efficiency. With the technique according to the present example, it is possible to provide a highly usable non-contact user interface capable of significantly reducing power consumption. In this way, t is possible to contribute to “Goal 9: Build resilient infrastructure, promote inclusive and sustainable industrialization and foster innovation” in the Sustainable Development Goals (SDGs) advocated by the United Nations.

In the foregoing, the present invention has been specifically described on the basis of the embodiment, but the present invention is not limited to the embodiment described above, and various modifications can be made within the range not departing from the gist thereof. Each component may be singular or plural unless particularly limited. The components of the respective examples can be added, deleted, replaced, or the like, except for essential components. A mode in which the examples are combined is also possible.

REFERENCE SIGNS LIST

1 video display apparatus
2 retroreflector
3 air floating video
11 liquid crystal display panel
12 absorption-type polarization plate
13 light source apparatus
21 λ/4 plate
101 beam splitter (polarization separation member)
105 cable
106 housing (second housing)
107 housing (first housing)
108 support column
300 video controller
400 air floating video display

The invention claimed is:

1. An air floating video display apparatus configured to display an air floating video, the air floating video display apparatus comprising:

a first housing configured to store a video controller;

a second housing separately provided from the first housing, connected by wire or wirelessly to the first housing, attachable at a position near a ceiling or a rearview mirror in a vehicle, and configured to store a video display apparatus and have an opening through which video light from the video display apparatus is emitted;

a retroreflector arranged outside the second housing, arranged so as to face the opening of the second housing, and having a λ/4 plate provided on a retroreflection surface; and a polarization separation member arranged at a predetermined angle with respect to the second housing and the retroreflector, in a space connecting the second housing and the retroreflector outside the second housing, wherein the polarization separation member is arranged such that one end side thereof is in contact with a surface having the opening of the second housing and the other side thereof is connected to the retroreflector, wherein the video display apparatus includes a light source apparatus and a liquid crystal display panel as a video source, and wherein a video light of a specific polarized wave emitted from the liquid crystal display panel passes through the opening of the second housing and through the polarization separation member, is reflected by the retroreflector, and passes through the λ/4 plate to be subjected to polarization conversion into a video light of the other polarized wave, the video light of the other polarized wave is reflected by the polarization separation member, and an air floating video that is a real image is displayed at a predetermined position on the basis of the reflected video light.

2. The air floating video display apparatus according to claim 1, wherein the polarization separation member and the retroreflector are suspended downward from the surface of the opening of the second housing.

3. The air floating video display apparatus according to claim 1, wherein the polarization separation member and the retroreflector are supported by a support column with respect to the second housing.

4. The air floating video display apparatus according to claim 3, wherein the support column comprises a plurality of support columns, and the support columns include a support column configured to support the polarization separation member, a support column configured to support the retroreflector, and a support column configured to connect a lower surface of the second housing and the retroreflector.

5. The air floating video display apparatus according to claim 3, wherein a wall made of a transparent member that connects a lower surface of the second housing and the retroreflector is provided behind the polarization separation member.

6. The air floating video display apparatus according to claim 3, wherein the support column comprises a plurality of support columns, and the support columns include a support column configured to support the polarization separation member, a support column configured to support the retroreflector, a horizontal support column which is provided on a side on a front side or a rear side of the retroreflector and is longer than a width of the side, and a vertical support column which connects a lower surface of the second housing and the horizontal support column.

7. The air floating video display apparatus according to claim 3, wherein a main surface of the retroreflector has a trapezoidal shape, wherein a side of the trapezoidal shape on a rear side is longer than a side on a front side, and wherein the support column comprises a plurality of support columns, and the support columns include a support column configured to support the polarization separation member and a support column configured to support the retroreflector having the trapezoidal shape.

8. The air floating video display apparatus according to claim 3, wherein a surface of the support column has a light shielding property for preventing reflection of an external light.

9. The air floating video display apparatus according to claim 3, wherein the support column is made of a transparent member.

10. The air floating video display apparatus according to claim 1, wherein a second λ/4 plate is arranged between the polarization separation member and the predetermined position where the air floating video is formed.

11. The air floating video display apparatus according to claim 1, wherein the polarization separation member is made of a reflection-type polarization plate or a metal multilayer film that reflects the specific polarized wave.

12. The air floating video display apparatus according to claim 1, wherein the video display apparatus includes an absorption-type polarization plate provided on a video light emission side of the liquid crystal display panel, or an antireflection film is provided on a video display surface of the liquid crystal display panel.

13. The air floating video display apparatus according to claim 1, wherein a surface roughness of a retroreflection surface of the retroreflector is set such that a ratio between a blur amount of the air floating video and a pixel size of the video display apparatus is equal to or less than 40%, wherein the light source apparatus includes:

a point-like or planar light source;

an optical element configured to reduce a divergence angle of light from the light source;

a polarization converter configured to align the light from the light source to polarization of a specific direction; and a light guide body having a reflection surface configured to propagate the light from the light source to the liquid crystal display panel, and wherein a video light flux of the video light from the liquid crystal display panel is controlled based on a shape and a surface roughness of the reflection surface.

* * * * *